(12) United States Patent
Zamir et al.

(10) Patent No.: US 10,979,072 B2
(45) Date of Patent: Apr. 13, 2021

(54) PUNCTURED BIT ESTIMATION AND BIT ERROR RATE ESTIMATION

(71) Applicant: Western Digital Technologies, Inc., San Jose, CA (US)

(72) Inventors: Ran Zamir, San Jose, CA (US); Eran Sharon, San Jose, CA (US); Idan Goldenberg, San Jose, CA (US); Dudy David Avraham, San Jose, CA (US)

(73) Assignee: Western Digital Technologies, Inc., San Jose, CA (US)

( * ) Notice: Subject to any disclaimer, the term of this patent is extended or adjusted under 35 U.S.C. 154(b) by 91 days.

(21) Appl. No.: 16/357,522

(22) Filed: Mar. 19, 2019

(65) Prior Publication Data
US 2020/0304149 A1 Sep. 24, 2020

(51) Int. Cl.
*H03M 13/11* (2006.01)
*G06F 17/15* (2006.01)

(52) U.S. Cl.
CPC ......... *H03M 13/1128* (2013.01); *G06F 17/15* (2013.01); *H03M 13/1168* (2013.01)

(58) Field of Classification Search
CPC .................... H03M 13/1128; H03M 13/1168; G06F 17/15
See application file for complete search history.

(56) References Cited

U.S. PATENT DOCUMENTS 6,671,852 B1 * 12/2003 Ariel ................. H03M 13/2975
714/780
2016/0246674 A1 * 8/2016 Chen ....................... G11C 16/26

* cited by examiner

*Primary Examiner* — Thien Nguyen
(74) *Attorney, Agent, or Firm* — Dickinson Wright PLLC; Steven Hurles

(57) ABSTRACT

A method for punctured bit estimation includes receiving a punctured codeword. The method further includes generating a reconstructed codeword using the punctured codeword and at least one punctured bit having a default logic value. The method further includes generating a syndrome vector for the reconstructed codeword. The method further includes determining, using the syndrome vector, a number of unsatisfied parity-checks for the at least one punctured bit. The method further includes determining, for the at least one punctured bit, a bit value using, at least, the number of unsatisfied parity-checks associated with the at least one punctured bit.

20 Claims, 12 Drawing Sheets

PUNCTURED BIT ESTIMATION AND BIT ERROR RATE ESTIMATION

TECHNICAL FIELD

This disclosure relates to memory systems, and in particular, to methods and systems for LDPC code length adjustment.

BACKGROUND

In memory systems, increasing the read throughput requires increasing the throughput required of the error correction code (ECC) decoder. To meet increasing throughput requirements, the ECC code matrix has a structure that allows for parallel decoding. This structure, referred to as Quasi-Cycle low-density parity-check (QC-LDPC), gathers the bits of the code into tuples of Z-bits, which may then be decoded in parallel, thereby allowing for an increase in throughput.

A byproduct of the QC-LDPC structure is that the ECC decoder can only support code lengths that are multiples of the Z-bits, and cannot use the remainder of the parity bits. However, the actual amount of parity bits to be stored in the memory is typically dependent on the cost and size (e.g., geometry) of the memory, not on the ECC code structure. In turn, the amount of parity bits to be stored in the memory and the amount of parity bits generated by a QC-LDPC code structure supported by the decoder often do not align. Use of controllers or memory that are designed or manufactured by third parties can also contribute to the misalignment. The result of the misalignment is unused bits in the memory.

The requirements for parallel decoding continue to increase in line with the continuously increasing throughput requirements. At the same time, additional bits added in new memory die designs have significant impact on the cost of the memory dies, implicating that the increased amount of unused bits is becoming worse. As such, ways to minimize the number of unused bits while maintaining sufficient decoding parallelism in order to attain throughput requirements is desirable.

SUMMARY

This disclosure relates generally to memory management systems and methods.

An aspect of the disclosed embodiments is a method for punctured bit estimation. The method includes receiving a punctured codeword. The method further includes generating a reconstructed codeword using the punctured codeword and at least one punctured bit having a default logic value. The method further includes generating a syndrome vector for the reconstructed codeword. The method further includes determining, using the syndrome vector, a number of unsatisfied parity-checks for at least one punctured bit. The method further includes determining, for the at least one punctured bit, a bit value using, at least, the number of unsatisfied parity-checks associated with the at least one punctured bit.

Another aspect of the disclosed embodiments is a memory system that includes a non-volatile storage and a controller. The non-volatile storage includes at least one memory die and the controller is in communication with the at least one memory die. The controller is configured to: receive a punctured codeword; generate a reconstructed codeword using the punctured codeword and at least one punctured bit having a default logic value; generate a syndrome vector for the reconstructed codeword; determine, using the syndrome vector, a number of unsatisfied parity-checks for the at least one punctured bit; and determine, for the at least one punctured bit, a bit value using, at least, the number of unsatisfied parity-checks associated with the at least one punctured bit.

Another aspect of the disclosed embodiments is a method for bit error rate estimation. The method includes calculating an initial syndrome weight of an initially reconstructed codeword using syndrome values of a first syndrome vector associated with the initially reconstructed codeword. The method also includes generating a modified reconstructed codeword using a punctured codeword and at least one punctured bit having a default logic value. The method also includes generating a second syndrome vector for the modified reconstructed codeword by performing a dot product operation on a parity-check matrix and a current bit values vector. The method also includes calculated an updated syndrome weight using the initial syndrome weight and the modified reconstructed codeword. The method also includes estimating a bit error rate for a read codeword using the updated syndrome weight.

These and other aspects of the present disclosure are disclosed in the following detailed description of the embodiments, the appended claims, and the accompanying figures.

BRIEF DESCRIPTION OF THE DRAWINGS

The accompanying drawings, which are incorporated in and constitute a part of this specification, illustrate various aspects of the description to explain its principles. Wherever convenient, the same reference numbers will be used throughout the drawings to refer to the same or like elements.

DETAILED DESCRIPTION

The following discussion is directed to various embodiments of the invention. Although one or more of these embodiments may be preferred, the embodiments disclosed should not be interpreted, or otherwise used, as limiting the scope of the disclosure, including the claims. In addition, one skilled in the art will understand that the following description has broad application, and the discussion of any embodiment is meant only to be exemplary of that embodiment, and not intended to intimate that the scope of the disclosure, including the claims, is limited to that embodiment.

The following embodiments describe apparatuses, devices, systems, circuits, and methods for estimating bit values of punctured bits for various error correction and bit error rate (BER) schemes.

Figure 1A:
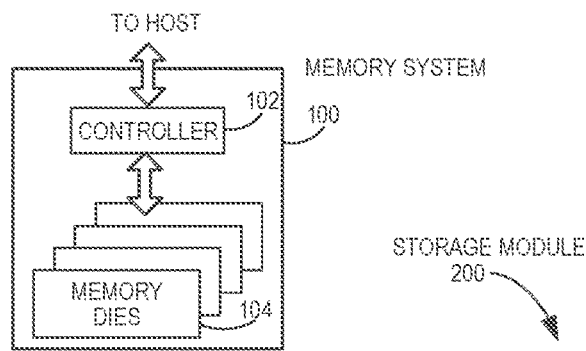
FIG. 1A generally illustrates a block diagram of an example memory system.

FIG. 1A is a block diagram illustrating a memory system 100. The memory system 100 may include a controller 102 and memory that may include or be made up of one or more memory dies 104. As used herein, the term die refers to the set of memory cells, and associated circuitry for managing the physical operation of those memory cells, that are formed on a single semiconductor substrate. The controller 102 may interface with a host system and transmit command sequences for read, program, and erase operations to the non-memory die(s) 104.

The controller 102 (which may be a flash memory controller) can take the form of processing circuitry, a microprocessor or processor, and a computer-readable medium that stores computer-readable program code (e.g., software or firmware) executable by the (micro)processor, logic gates, switches, an application specific integrated circuit (ASIC), a programmable logic controller, and an embedded microcontroller, for example. The controller 102 can be configured with hardware and/or firmware to perform the various functions described below and generally illustrated in the flow diagrams. In addition, some of the components shown as being internal to the controller can also be stored external to the controller, and other components can be used. Additionally or alternatively, the phrase "operatively in communication with" could mean directly in communication with or indirectly (wired or wireless) in communication with through one or more components, which may or may not be shown or described herein.

As used herein, the controller 102 is a device that manages data stored in the memory die(s) and communicates with a host, such as a computer or electronic device. The controller 102 can have various functionality in addition to the specific functionality described herein. For example, the controller 102 can format the memory dies 104 to ensure that the memory dies 104 are operating properly, map out bad flash memory cells, and allocate spare cells to be substituted for future failed cells. Some part of the spare cells can be used to hold firmware to operate the controller 102 and implement other features. In operation, when a host needs to read data from or write data to the memory die(s) 104, the host will communicate with the controller 102. If the host provides a logical address to which data is to be read/written, the controller 102 can convert the logical address received from the host to a physical address in the memory die(s) 104. (Alternatively, the host can provide the physical address). The controller 102 can also perform various memory management functions, such as, but not limited to, wear leveling (distributing writes to avoid wearing out specific blocks of memory that would otherwise be repeatedly written to) and garbage collection (after a block is full, moving only the valid pages of data to a new block, so the full block can be erased and reused).

The interface between the controller 102 and the non-volatile memory die(s) 104 may be any suitable interface, such as flash interface, including those configured for Toggle Mode 200, 400, 800, 1000 or higher. For some example embodiments, the memory system 100 may be a card based system, such as a secure digital (SD) or a micro secure digital (micro-SD) card. In alternate example embodiments, the memory system 100 may be part of an embedded memory system.

In the example illustrated in FIG. 1A, the memory system 100 is shown as including a single channel between the controller 102 and the non-volatile memory die(s) 104. However, the subject matter described herein is not limited to memory systems having a single memory channel. For example, in some memory systems, such as those embodying NAND architectures, 2, 4, 8, or more channels may exist between the controller 102 and the memory die(s) 104, depending on controller capabilities. In any of the embodiments described herein, more than a single channel may exist between the controller and the memory die(s) 104, even if a single channel is generally illustrated in the drawings.

Figure 1B:
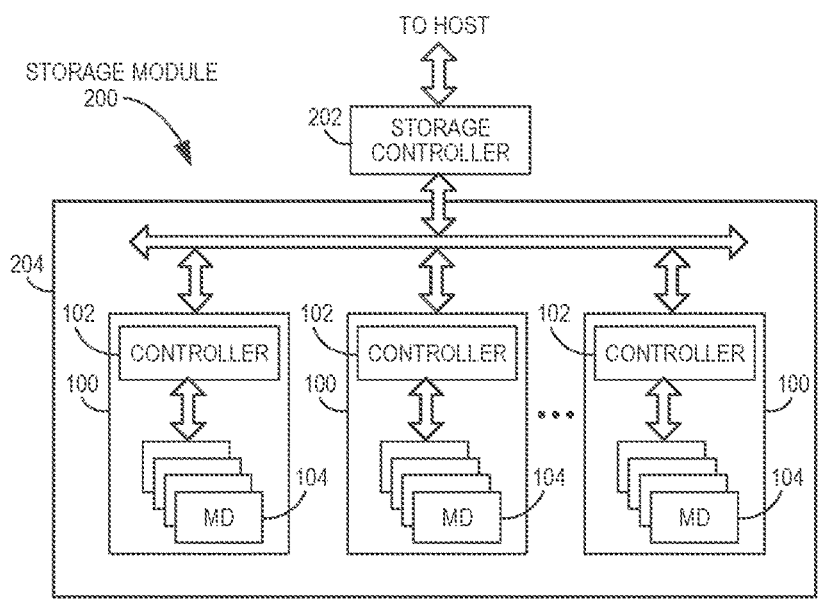
FIG. 1B generally illustrates a block diagram of an example storage module that includes a plurality of memory systems.

FIG. 1B illustrates a storage module 200 that includes a plurality of non-volatile memory systems 100. As such, the storage module 200 may include a storage controller 202 that interfaces with a host and with a storage system 204, which includes a plurality of non-volatile memory systems 100. The interface between the storage controller 202 and non-volatile memory systems 100 may be a bus interface, such as a serial advanced technology attachment (SATA), a peripheral component interface express (PCIe) interface, an embedded Multimedia Card (eMMC) interface, a SD interface, or a Universal Serial Bus (USB) interface, as examples. The storage module 200, in one embodiment, may be a solid-state drive (SSD), such as found in portable computing devices, such as laptop computers and tablet computers, and mobile phones.

Figure 1C:
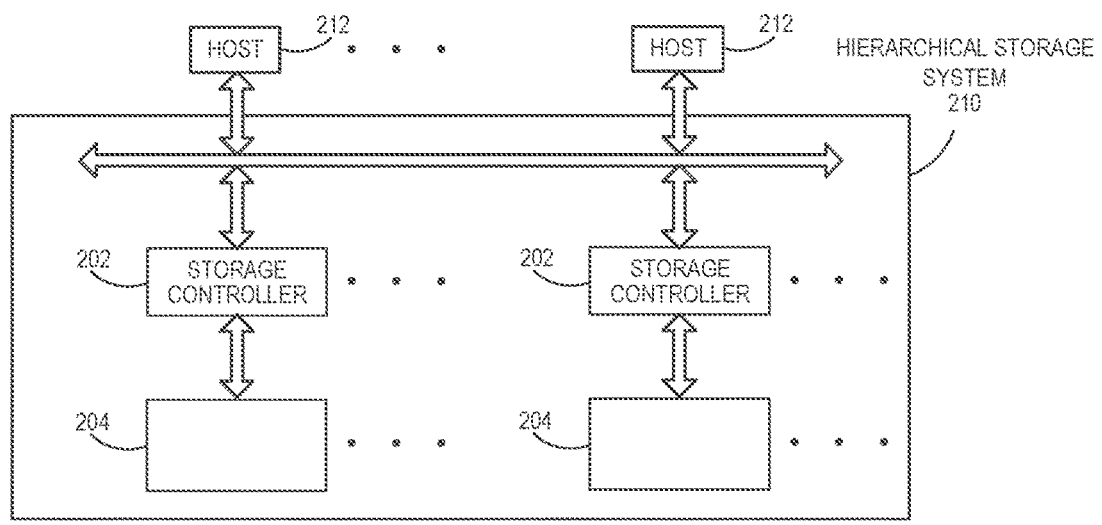
FIG. 1C generally illustrates a block diagram of an example hierarchical storage system.

FIG. 1C is a block diagram illustrating a hierarchical storage system 210. The hierarchical storage system 210 may include a plurality of storage controllers 202, each of which control a respective storage system 204. Host systems 212 may access memories within the hierarchical storage system 210 via a bus interface. Example bus interfaces may include a non-volatile memory express (NVMe), a fiber channel over Ethernet (FCoE) interface, an SD interface, a USB interface, a SATA interface, a PCIe interface, or an eMMC interface as examples. In one embodiment, the storage system 210 illustrated in FIG. 1C may be a rack mountable mass storage system that is accessible by multiple host computers, such as would be found in a data center or other location where mass storage is needed.

Figure 2A:
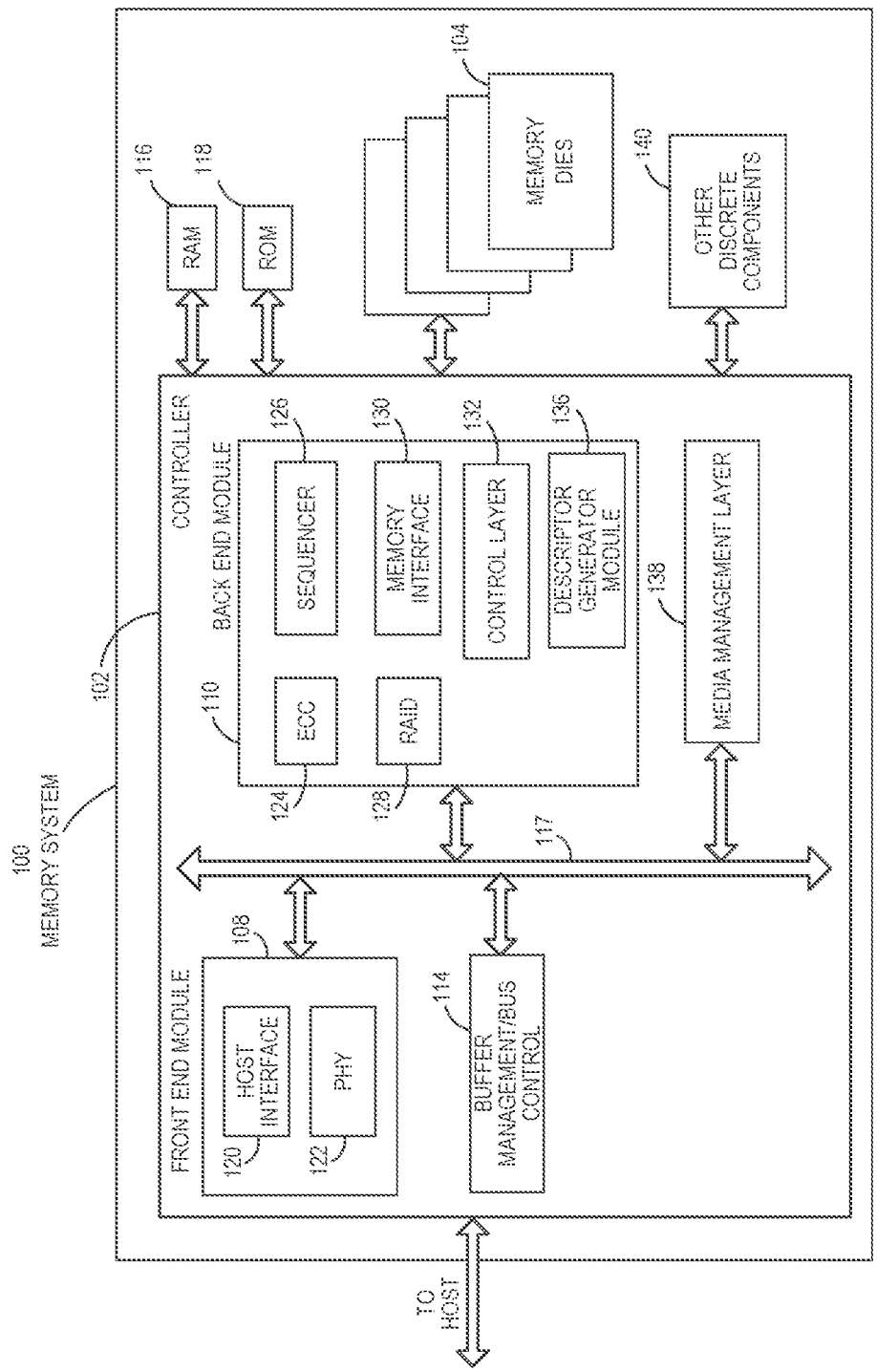
FIG. 2A generally illustrates a block diagram of an example configuration of components of a controller of the memory system of FIG. 1A.

FIG. 2A is a block diagram illustrating exemplary components of the controller 102 in more detail. The controller 102 may include a front-end module 108 that interfaces with a host, a back end module 110 that interfaces with the non-volatile memory die(s) 104, and various other modules that perform various functions of the non-volatile memory system 100. In general, a module may be hardware or a combination of hardware and software. For example, each module may include an application specific integrated circuit (ASIC), a field programmable gate array (FPGA), a circuit, a digital logic circuit, an analog circuit, a combination of discrete circuits, gates, or any other type of hardware or combination thereof. In addition or alternatively, each module may include memory hardware that comprises instructions executable with a processor or processor circuitry to implement one or more of the features of the module. When any one of the module includes the portion of the memory that comprises instructions executable with the processor, the module may or may not include the processor. In some examples, each module may just be the portion of the memory that comprises instructions executable with the processor to implement the features of the corresponding module without the module including any other hardware. Because each module includes at least some hardware even when the included hardware comprises software, each module may be interchangeably referred to as a hardware module.

The controller 102 may include a buffer manager/bus controller module 114 that manages buffers in random access memory (RAM) 116 and controls the internal bus arbitration for communication on an internal communications bus 117 of the controller 102. A read only memory (ROM) 118 may store and/or access system boot code. Although illustrated in FIG. 2A as located separately from the controller 102, in other embodiments one or both of the RAM 116 and the ROM 118 may be located within the controller 102. In yet other embodiments, portions of RAM 116 and ROM 118 may be located both within the controller 102 and outside the controller 102. Further, in some implementations, the controller 102, the RAM 116, and the ROM 118 may be located on separate semiconductor dies.

Additionally or alternatively, the front-end module 108 may include a host interface 120 and a physical layer interface (PHY) 122 that provide the electrical interface with the host or next level storage controller. The choice of the type of the host interface 120 can depend on the type of memory being used. Example types of the host interface 120 may include, but are not limited to, SATA, SATA Express, SAS, Fibre Channel, USB, PCIe, and NVMe. The host interface 120 may typically facilitate transfer for data, control signals, and timing signals.

The back end module 110 may include an error correction code (ECC) module (also referred to as an ECC engine) 124 configured to perform an parity bit generation process (or an encoding process) during which the ECC module 124 generates parity bits for the data received from the host, and an error correction process (or a decoding process) during which the ECC module 124 error corrects the data bits read from the memory die(s) 104. Further operation and functionality of the ECC module 124 is described in further detail below.

The back end module 110 may also include a command sequencer 126 that generates command sequences, such as program, read, and erase command sequences, to be transmitted to the non-volatile memory die(s) 104. Additionally or alternatively, the back end module 110 may include a RAID (Redundant Array of Independent Drives) module 128 that manages generation of RAID parity and recovery of failed data. The RAID parity may be used as an additional level of integrity protection for the data being written into the non-volatile memory system 100. In some cases, the RAID module 128 may be a part of the ECC module 124. A memory interface 130 provides the command sequences to the non-volatile memory die(s) 104 and receives status information from the non-volatile memory die(s) 104. Along with the command sequences and status information, data to be programmed into and read from the non-volatile memory die(s) 104 may be communicated through the memory interface 130. In one embodiment, the memory interface 130 may be a double data rate (DDR) interface and/or a Toggle Mode 200, 400, 800, or higher interface. A control layer 132 may control the overall operation of back end module 110.

In addition, the back end module 110 may include a descriptor generator module 136 that is configured to generate descriptors at least for the parity bit and error correction processes performed by the ECC module 124. As described in further detail below, when data is to be written to the non-volatile memory dies 104, such as in response to a host write request, the descriptor generator module 136 may generate a descriptor associated with the data and provide the descriptor to the ECC module 124. In response to receipt of the descriptor, the ECC module 124 may retrieve the data, which may be stored in RAM 116, and encode the data prior to it being written to the non-volatile memory dies 104. In addition, when data is read from the non-volatile memory dies 104, such as in response to a host read request, the descriptor generator module 136 may generate a descriptor associated with the data and provide the descriptor to the ECC module 124. In response to receipt of the descriptor, the ECC module 124 may retrieve the data, which may be stored in RAM 116, and error correct the data prior to it being sent to its final destination, such as to the host.

Additional modules of the non-volatile memory system 100 illustrated in FIG. 2A may include a media management layer 138 that performs certain memory management functions such as wear leveling of memory cells of the memory dies 104, address management, and facilitates folding operations. Other memory management functions may be possible. The non-volatile memory system 100 may also include other discrete components 140, such as external electrical interfaces, external RAM, resistors, capacitors, or other components that may interface with the controller 102. In alternative embodiments, one or more of the RAID module 128, media management layer 138 and buffer management/bus controller 114 are optional components that may not be necessary in the controller 102.

Figure 2B:
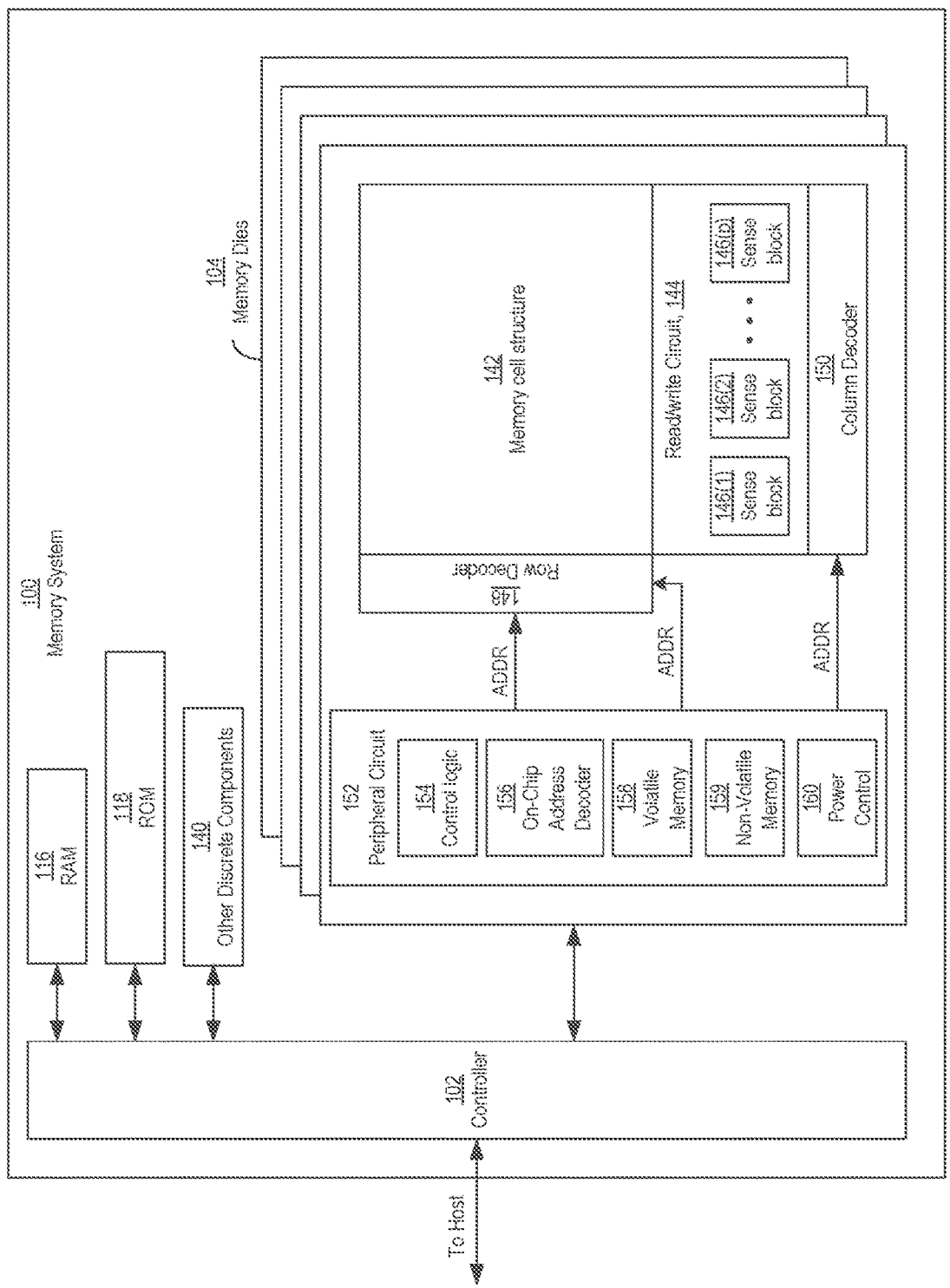
FIG. 2B generally illustrates a block diagram of an example configuration of components of a memory die of the memory system of FIG. 1A.

FIG. 2B is a block diagram of an example configuration of components of a memory die 104 in more detail. The memory die 104 may include a memory cell structure 142 that includes a plurality of memory cells, otherwise or interchangeably referred to as memory elements. A memory cell is an element or component that stores a unit of data having an n-bit data value, where n is one or more. Any suitable type of memory can be used for the memory cells of the memory cell structure 142. As examples, the memory can be dynamic random access memory ("DRAM") or static random access memory ("SRAM"), non-volatile memory, such as resistive random access memory ("ReRAM"), electrically erasable programmable read only memory ("EEPROM"), flash memory (which can also be considered a subset of EEPROM), ferroelectric random access memory ("FRAM"), magnetoresistive random access memory ("MRAM"), phase-change memory ("PCM"), or other elements comprising semiconductor material or other material capable of storing information. Each type of memory may have different configurations. For example, flash memory may be configured in a NAND or a NOR configuration.

The memory can be formed from passive and/or active elements, in any combinations. By way of non-limiting example, passive semiconductor memory elements include ReRAM device elements, which in some embodiments include a resistivity switching storage element, such as an anti-fuse, phase change material, etc., and optionally a steering element, such as a diode, etc. Further, by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory cells may be configured so that they are connected in series or so that each element is individually accessible. By way of non-limiting example, flash memory devices in a NAND configuration (NAND memory) typically contain memory elements connected in series. A NAND memory array may be configured so that the array is composed of multiple cell groups, where the memory cells that are part of the same cell group share a single bias line, such as a single word line or a single bit line, and are accessed or biased as a group. Alternatively, memory cells may be configured so that each element is individually accessible, e.g., a NOR memory array. NAND and NOR memory configurations are exemplary, and memory cells may be otherwise configured.

A plurality of memory cells that form the memory cell structure 142 of a memory die may be located within and/or over a substrate. The substrate may be a wafer over, in which the layer of the memory cells are formed, or it may be a carrier substrate, which is attached to the memory cells after they are formed. As a non-limiting example, the substrate may include a semiconductor and/or be made of a semiconductor material, such as silicon.

In addition, a plurality of memory cells that form the entire memory cell structure 142 or at least a portion of the memory cell structure 142 may be arranged in two dimensions or in three dimensions. A plurality of memory cells arranged in two dimensions is referred to as a two-dimensional (2-D) memory cell structure. A plurality of memory cells arranged in three dimensions is referred to as a three-dimensional (3-D) memory cell structure.

In a two-dimensional memory cell structure, the memory cells are arranged in a single plane or a single memory device level. Typically, in a two-dimensional memory cell structure, the memory cells are arranged in a plane (e.g., in an x-y direction plane) that extends substantially parallel to a major surface of a substrate that supports the memory cells.

In a three-dimensional memory cell structure, the memory cells are arranged so that memory cells occupy multiple planes or multiple memory device levels (e.g., multiple x-y direction planes), thereby forming a structure in three dimensions (i.e., in the x, y and z directions, where the z direction is substantially perpendicular to and the x and y directions are substantially parallel to the major surface of the substrate). When configured as a three-dimensional memory cell structure, the memory cells extend up or away from the major surface of the substrate.

As a non-limiting example, a three dimensional memory structure may be vertically arranged as a stack of multiple two dimensional memory device levels. As another non-limiting example, a three-dimensional memory array may be arranged as multiple vertical columns (e.g., columns extending substantially perpendicular to the major surface of the substrate, i.e., in the z direction) with each column having multiple memory cells in each column. The columns may be arranged in a two-dimensional configuration, e.g., in an x-y plane, resulting in a three-dimensional arrangement of memory cells, with the memory cells on multiple vertically stacked memory planes. Other configurations of memory cells in three dimensions can also constitute a three dimensional memory array.

In at least some example configurations, a two-dimensional or a three-dimensional memory cell structure may be in the form of or configured as an ordered array (or just array). One type of an array is an orthogonal array, which is a matrix-like structure that includes rows and columns. The memory cells are arranged in the rows and columns. At the intersection of a row and a column is a memory cell. However, in other configurations, the memory cells may be arrayed in non-regular or non-orthogonal configurations.

Figure 3A:
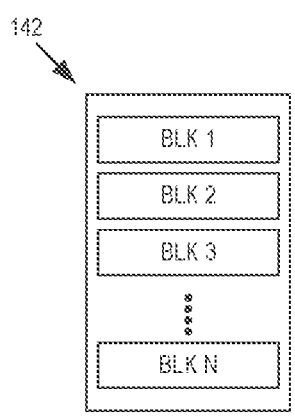
FIG. 3A generally illustrates a block diagram of a memory cell structure organized into blocks.

Referring to FIG. 3A, the memory cell structure 142 located on a single memory die 104 may be organized into an N-number of blocks, extending from a first block BLK 1 to an Nth block BLK N. A block is a minimum unit of erase of a memory die 104. Memory cells that are part of the same block are erased at the same time and/or as part of a same erase operation.

Figure 3B:
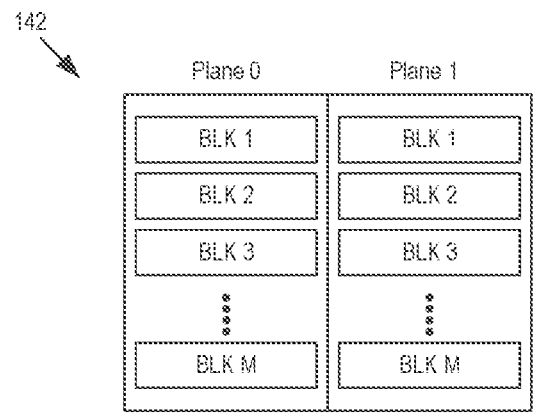
FIG. 3B generally illustrates a block diagram of a memory cell structure organized into blocks in different memory planes.

Referring to FIG. 3B, for some example configurations, the N-number of blocks located on a single memory die 104 are organized into a plurality of memory planes (or just planes). FIG. 3B generally illustrates an example configuration where the blocks are organized into two memory planes, including a first memory plane Plane 0 and a second memory plan Plane 1. Configurations that include more than two memory planes may be possible. In FIG. 3B, each memory plane is shown as including an M-number of blocks, extending from a first block BLK 1 to an Mth block BLK M. In at least some example configurations, blocks that are part of the same plane may be oriented in and/or form a column or a one-dimensional array of blocks, although other configurations of blocks in a single plane may be possible.

Figure 3C:
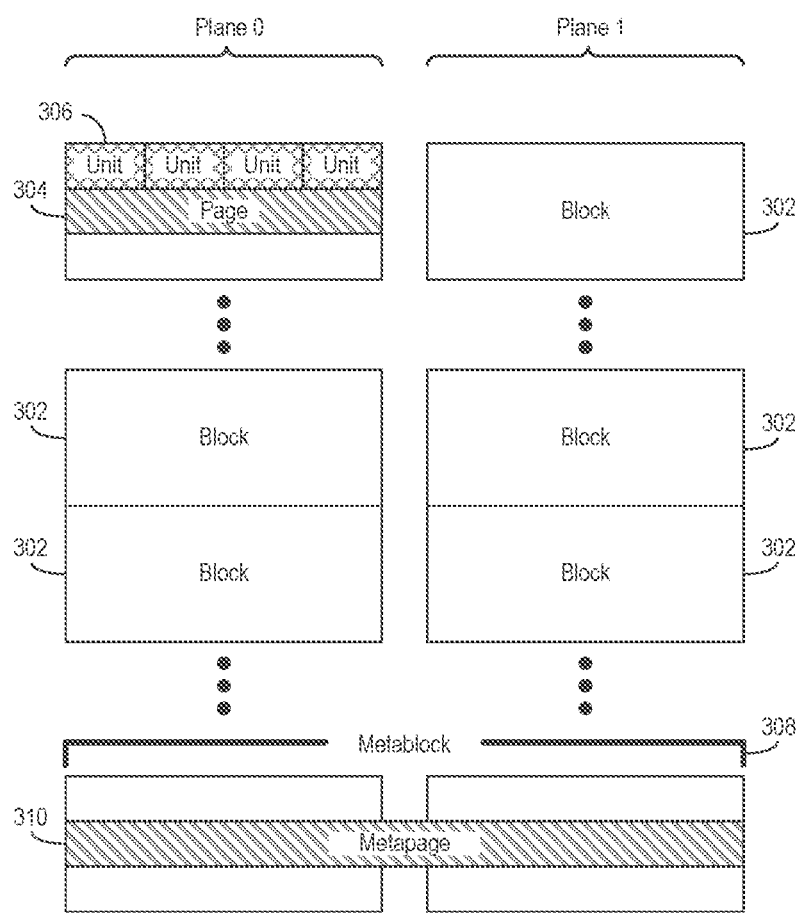
FIG. 3C generally illustrates a metablock and a metapage spanning multiple memory planes.

Referring to FIG. 3C, a memory array structure 142 of a memory die 104, and/or a plurality of memory cell structures 142 spanning multiple memory dies 104, may have an organizational arrangement or hierarchy under which data is programmed into, read from, addressed, grouped, or identified in the memory cell structure(s) 142. The controller 102 may be configured to program into, read from, address, group, or identify data in accordance with the organizational arrangement or hierarchy.

FIG. 3C is a block diagram of an example organizational arrangement or hierarchy of a memory cell structure 142. As mentioned, the memory cells may be divided, or organized into blocks 302 that store blocks of data. A block of data may further be divided into pages of data 304. A page 304 may be a data unit of sensing from a memory cell structure 142 and/or a unit of programming data into a memory cell structure 142. Each individual page 304 may further be divided into segments or units 306 data, with each segment or unit 306. A segment or unit 306 of data—also referred to as a flash memory unit (FMU), an ECC page, or a codeword—may include an amount of data that is written at one time during a program operation and/or an amount of data for which parity bits are generated or error corrected by the ECC module 124 during a single parity bit generation or an error correction process. Example numbers of segments or units of a page may be four or eight, although other numbers are possible.

Additionally or alternatively, the organizational arrangement or hierarchy may include metablocks 408 and metapages 310. A metablock address or number identifying a metablock may be mapped to and/or correspond to a logical address (e.g., a logical group number) provided by a host. A metablock 308 and a metapage 310 may span or be distributed across a respective single block and page in a single plane, or alternatively, may span or be distributed across respective multiple blocks and multiple pages across multiple planes. FIG. 3C generally illustrates a metablock 308 and a metapage 310 spanning across two planes, Plane 0 and Plane 1. Depending on the organizational arrangement, metablocks 308 and metapages 310 spanning across multiple planes may span across only those planes of a single memory die 104, or alternatively may span across multiple planes located of multiple memory dies 104.

In addition, the memory cells of a block may be arranged two-dimensionally in a two-dimensional (2-D) memory array or three-dimensionally in a three-dimensional (3-D) memory array. A two-dimensional block is a block that has memory cells arranged two-dimensionally. A three-dimensional block is a block that has memory cells arranged three-dimensionally.

Figure 4A:
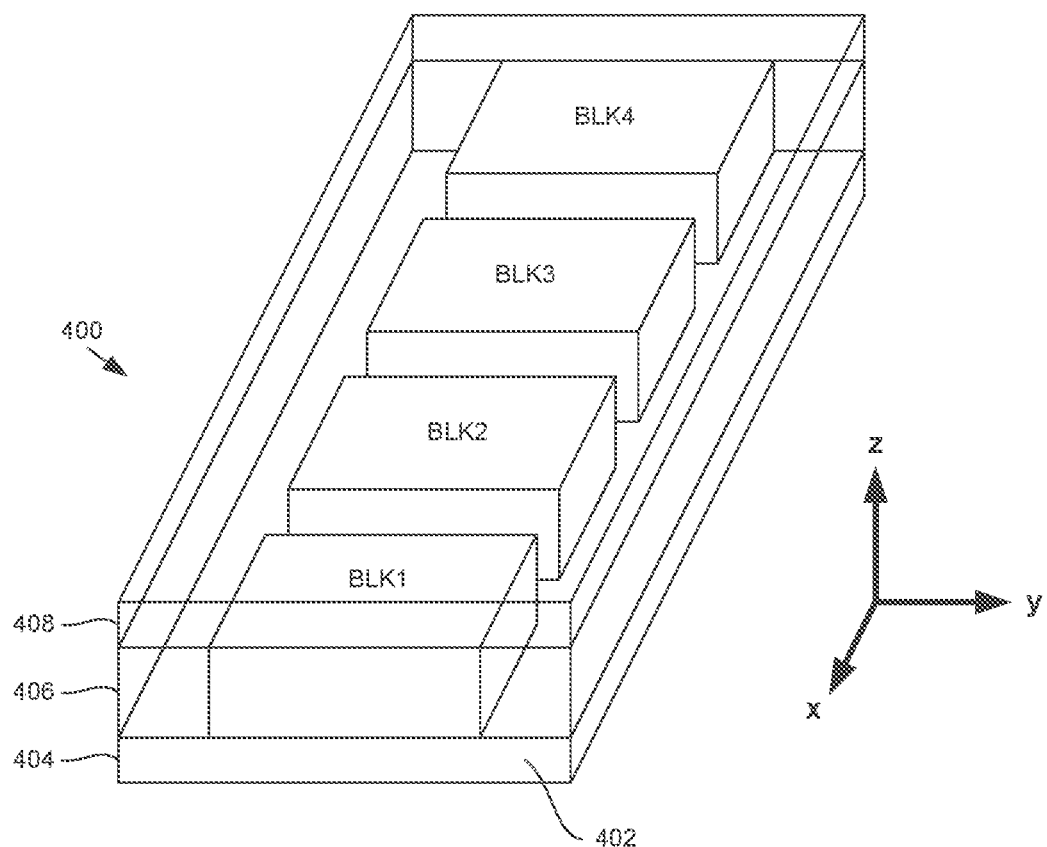
FIG. 4A generally illustrates a perspective view of at least a portion of the memory die of FIG. 2B that includes a plurality of three-dimensional blocks.

FIG. 4A generally illustrates a perspective view of at least a portion of a memory die 104 that includes a set or a plurality of three-dimensional blocks 400, which may represent at least a portion of the memory cell structure 142 of FIG. 2B. For simplicity, the plurality of blocks 400 is shown as including four blocks, BLK1, BLK2, BLK3, and BLK4. In actual implementation, a given memory cell structure 142 of a memory die 104 may include several more blocks than four, such as on the order of hundreds, thousands, or tens of thousands of blocks. In a particular example configuration, one plane of blocks includes 2,000 blocks.

The blocks 400 are located or disposed on a substrate 402 of the memory die 104. The substrate 402 may be part of a lower level or region 404 of the memory die 104 that carries or includes circuitry under the blocks 400, along with one or more lower metal layers patterned to form conductive paths that carry or supply signals or voltages output from the circuitry, such as those used to perform memory operations (read, program, sense, erase, e.g.).

The blocks 400 are disposed in an intermediate level or region 406 (also referred to as a block level or region, or an array level or region) of the memory die 104 in between the lower region 404 and an upper level or region 408 of the memory die 104. The upper region 408 may include one or more upper metal layers patterned in the form of conductive paths that carry or supply signals or voltages output from the circuitry.

The substrate 402 is generally a planar structure having opposing planar surfaces. Herein, the components on a memory die 104 can be physically described with reference to a three-dimensional Cartesian coordinate system having an x-axis, a y-axis, and a z-axis. The z-axis is the axis that extends perpendicular to the planar surfaces of the substrate 402. In general, the components on a memory die 104 are disposed on and/or extend from one of the planar surfaces in a z-direction that is parallel with the z-axis. The terms "above" and "below" as well as other terms such as "top" and "bottom" and "upper" and "lower" are used herein to describe relative positioning of components of the memory die 104 along or with reference to the z-axis. For example, the blocks 400 are "above" the substrate 402, and the substrate 402 is part of the lower region 404 that is "below" the blocks 400. In addition, the upper region 408 is a region of the memory die 104 "above" both the blocks 400 and the substrate 402. Components of the memory die 104 disposed in the upper region 408 are farther away in the z-direction from the substrate 402 than components of the blocks 400. In general, for two components on a given memory die 104, where the first component is "above" the second component, the first component is positioned or disposed farther in the z-direction from the substrate 402 than the second component. In addition, where the first component is "below" the second component, the first component is positioned or disposed closer in the z-direction to the substrate 402 than the second component.

The terms "top" and "bottom" are also used to refer to the relative positioning of components of the memory die 104 in the z-direction and/or along the z-axis. In general, "bottom" components are positioned or disposed closer in the z-direction to the substrate 402 than "top" components, and "top" components are positioned or disposed farther in the z-direction from the substrate 402 than "bottom" components. In this context, a memory die 104 may include one or more top metal layers disposed in the upper region 408 and one or more bottom metal layers disposed in the lower region 404. In general, the bottom metal layers are positioned or disposed closer in the z-direction to the substrate 402 than the top metal layers, and the top metal layers are positioned or disposed farther in the z-direction from the substrate 402 than the bottom metal layers.

Although the terms "upper" and "lower," "above" and "below," and "top" and "bottom" are used to describe the relative position of components on a memory die 104, they should not be construed as limiting the relative positioning of the components since a memory die 104, or the memory system 100 as a whole, can be oriented in any of various positions.

With respect to the components of a block, a block includes a plurality of bias elements and a plurality of control lines. A bias element is a component or unit of a block that receives, is biased with, and/or that responds to a bias. A bias, as used in conjunction with a bias element of a block, is a voltage, a current, a plurality of voltages, a plurality of currents, or a combination of at least one voltage and at least one current that is applied to and/or received by the bias element to cause a response from the bias element or configure the bias element in a particular state. A bias is applied or supplied to the bias element, or the bias element is biased with the bias, at one or more levels to induce a response or configure the bias element in a particular state in order for a memory operation to be carried out.

The plurality of bias elements of a block may all be of a single type or may each be one of a plurality of different types. Bias elements of different types may perform different functions in the block and/or may be biased with different biases at different levels during the memory operations.

One type of bias element is a memory cell. Memory cells that are part of the same block are referred to as a block of memory cells. Other types of bias elements may be possible, depending on the memory technology. In NAND technology, other types of bias elements may include dummy cells, drain select gate transistors (referred to as SGD transistors), and source select gate transistors (referred to as SGS transistors). At least with NAND technology, dummy cells are memory cells that do not store data from a host, and are disposed coplanar with dummy word line layers that shield memory cells and word line layers from certain edge effects.

SGD transistors and SGS transistors may be configured to be enabled (turn on) and disabled or inhibited (turn off), or otherwise configured in conductive and non-conductive states, at certain time and/or in response to certain biases to allow memory operations to be performed—e.g., to allow data to be programmed into, read from, or erased from the memory cells. Bias element types other than or in addition to memory cells, dummy cells, SGD transistors, and/or SGS transistors may be possible.

In addition, a control line of a block is a conductive structure, element, or component of a block that supplies, applies, or outputs at least a part of a bias (such as a single voltage or a single current) to one or more bias elements of a block and/or that biases the one or more bias elements with at least part of the bias. In at least some example configurations, a control line functions as a contact line, in that it is the conductive line that physically extends to and contacts the one or more bias elements it biases, such as by contacting and/or forming at least a part of the electrodes or terminals of the bias element that it biases.

The control lines of a block may be organized, arranged, characterized, divided, or configured into a plurality of different types of control lines. The control lines may be organized into types by the way that they bias the bias elements. For example, control lines of the same type may bias the bias elements in the same way, such as by biasing the same type of bias elements and/or the same types of terminals of the bias elements.

For NAND technology, the control lines of a block may be organized into three main types, including control gate lines, bit lines, and source lines. A control gate line (at least for NAND technology) is a control line that applies a control gate voltage to one or more control gate terminals (or just control gate) of one or more bias elements, and/or that biases one or more control gate terminals of one or more bias elements with a control gate voltage.

A bit line (at least for NAND technology) is a control line that applies a bit line voltage to one or more terminals of one or more bias elements, and/or that biases one or more terminals of one or more bias elements with a bit line voltage. In particular example configurations, the bit lines bias the drain terminals (or just drains) of the bias elements. For such example configurations, the bit line voltage may alternatively be referred to as a drain voltage, where a bit line is a control line that applies a drain voltage to one or more drain terminals of one or more bias elements. In addition, for at least some example configurations, a bit line biases terminals of bias elements by applying its bit line voltage to one or more channels and/or associated channel element groups. In this context, the bit line voltage may alternatively be referred to as a channel voltage, where a bit line is a control line that applies a channel voltage to one or more channels and/or associated channel element groups. Otherwise stated, a channel voltage is a voltage that a control line applies to a channel. In particular example configurations, particularly those where the bit lines bias the drain terminals of bias elements, the bit lines bias drain ends or drain sides of one or more channels and/or associated channel element groups. In this context, a bit line voltage may alternatively be referred to as a drain-side channel voltage (or just drain-side voltage). Otherwise stated, a drain-side channel voltage (or just drain-side voltage) is a voltage that a control line applies to a drain end of a channel.

A source line (at least for NAND technology) is a control line that applies a source line voltage to one or more terminals of one or more bias elements, and/or that biases one or more terminals of one or more bias elements with a source line voltage. In particular example configurations, the source line biases the source terminals (or just sources) of the bias elements. For such example configurations, the source line voltage may alternatively be referred to as a source voltage, where a source line is a control line that applies a source voltage to one or more source terminals of one or more bias elements. In addition, for at least some example configurations, a source line biases terminals of bias elements by applying its source line voltage to one or more channels and/or associated channel element groups. In this context, the source line voltage may alternatively be referred to as a channel voltage, where a source line is a control line that applies a channel voltage to one or more channels and/or associated channel element groups. In particular example configurations, particular those where the sources lines bias the source terminals of bias elements, the source line biases source ends or source sides of one or more channels and/or associated channel element groups. In this context, a source line voltage may alternatively be referred to as a source-side channel voltage or (or just source-side voltage). Otherwise stated, a source-side channel voltage (or just source-side voltage) is a voltage that a control line applies to a source end of a channel.

In at least some example configurations, control gate lines of a block may be further organized, arranged, characterized, divided, or configured into a plurality of different control gate types (or sub-types). In particular, the control gate lines may be further arranged into the types of bias elements that they bias, and include word lines, dummy word lines, drain select gate lines (referred to as SGD lines), and source select gate lines (referred to as SGS lines).

A word line is a control gate line that applies a word line voltage to one or more control gates of one or more memory cells, and/or that biases one or more control gates of one or more memory cells with a word line voltage. A dummy word line is a control gate line that applies a dummy word line voltage to one or more control gates of one or more dummy cells, and/or that biases one or more control gates of one or more dummy cells with a dummy word line voltage. A drain select gate line (referred to as an SGD line) is a control gate line that applies a drain select gate voltage (referred to as a SGD line voltage) to one or more control gates of one or more SGD transistors, and/or that biases one or more control gates of one or more SGD transistors with an SGD line voltage. A source select gate line (referred to as a SGS line) is a control gate line that applies a source select gate voltage (referred to as a SGS line voltage) to one or more control gates of one or more SGS transistors, and/or that biases one or more control gates of one or more SGS transistors with an SGS line voltage.

For some example configurations of a three-dimensional block, at least one type of control line is implemented or formed as a plurality of layers. For example, in at least some 3-D NAND configurations, the control gate lines of a block are implemented or formed as layers. In general, a layer, otherwise referred to as a sheet or a plate, is a generally planar structure extending in the x-y directions perpendicular to the z-direction. A layer has opposing planar surfaces facing in opposite directions. One of the planar surfaces is a top surface that faces in the z-direction away from the substrate 402, and the other planar surface is a bottom surface that faces in the z-direction toward the substrate 402.

Herein, the terms "line" and "layer," at least as they are used to refer to control lines—except SGD lines as described in further detail below—are used interchangeably or as alternatives to each other. For example, the terms "control gate line" and "control gate layer" are used interchangeably;

the terms "word line" and "word line layer" are used interchangeably; the terms "dummy word line" and "dummy word line layer" are used interchangeably; and the terms "source select gate line" (or SGS line) and "source select gate layer" (or SGS layer) are used interchangeably.

In addition, for at least for some example configurations of 3-D NAND technology, a three-dimensional block includes a stack. In general, a stack is a plurality or a collection of layers disposed on top of one another. For 3-D NAND, a stack of a block includes a plurality of control gate layers and a plurality of dielectric layers. A dielectric layer, at least when implemented with control gate layers of a stack, is a layer that electrically isolates one control gate layer from another control gate layer. In the stack, the control gate layers and the dielectric layers are arranged in an alternating manner, in that as the stack extends in the z-direction away from the substrate, the layers consecutively alternate between control gate layers and dielectric layers. In this context, a stack of a three-dimensional block is a collection of alternatingly disposed control gate layers and dielectric layers.

A stack of a three-dimensional block includes outer surfaces and edges as defined by the side surfaces and edges of the layers, as well as a top surface of a top-most layer of the stack and a bottom surface of a bottom-most layer of the stack. The outer surfaces and edges of the stack, in turn, define an outer boundary of the stack. The bias elements of the three-dimensional block are three-dimensionally arranged within the outer boundary. In this context, the bias elements of the three-dimensional block are referred to as being disposed in or within the stack.

In addition, at least for some example configurations, the bias elements of a three-dimensional block are disposed coplanar (in the x-y direction) with control gate layers. In particular, the bias elements are coplanar with the control gate layers by which they are configured to be biased. Accordingly, memory cells configured to be biased by a particular word line layer are disposed coplanar with the particular word line layer; SGD transistors configured to be biased by a particular SGD layer are disposed coplanar with the particular SGD layer; SGS transistors configured to be biased by a particular SGS layer are disposed coplanar with the particular SGS layer; and dummy cells configured to by biased by a particular dummy word line layer are disposed coplanar with the particular dummy word line layer.

A bias element that is coplanar with and/or configured to be biased by a given control gate layer may be referred to as being disposed in, located in, and/or coupled to the given control gate layer. For example, a memory cell coplanar with and/or configured to be biased by a given word line may be referred to as being disposed in, located in, and/or coupled to the given word line layer.

In addition, at least for some example configurations of 3-D NAND technology, a three-dimensional block includes a plurality of channels. A channel is an elongate structure that extends in the z-direction through a stack of a block, around or about which bias elements of the block are formed or disposed. A bias element that is disposed or formed around or about a channel may at least partially, and in some configurations completely, encompass or surround the channel.

In addition, at least for some example configurations of 3-D NAND technology, bias elements of a block are biased by way of channels. Otherwise stated, a channel is structure of a block by which bias elements are biased. In particular, drain terminals and source terminals of bias elements are biased by way of channels. A bias element that has its source and drain terminals biased by a given channel is coupled to that given channel.

Each channel includes a respective drain end (or drain side) and a respective source end (or source side). A channel extends through a stack in the z-direction toward the substrate from its drain end to its source end. Bit lines of a block are electrically connected or coupled the drain ends of the channels, and the source line of a block is electrically connected or coupled to the source ends of the channels. In the example configurations of a block described herein, a bit line applies a bit line voltage (or drain voltage or drain-side voltage or drain-side channel voltage) to the one or more drain ends of one or more channels to which it is coupled. The source line applies a source line voltage (or source voltage or source-side voltage or source-side channel voltage) to the source ends of the channels to which it is coupled.

Additionally, as used herein, a channel element group is a plurality or a collection of bias elements that are formed or disposed around or about the same channel. A given channel and a given channel element group that includes the bias elements disposed or formed around or about the given channel are referred to as being coupled to and/or associated with each other. In addition, bias elements that are part of the same channel element group are referred as being coupled to each other.

For at least some example configurations, the bias elements of a channel element group include a plurality of memory cells, at least one SGD transistor, and at least one SGS transistor. In particular, example configurations, a channel element group may further include one or more dummy cells.

The channel element groups extend in the z-direction about their associated channels. Similar to the channels, the channel element groups each include respective drain ends (or drain sides) and source ends (or source sides). A channel extends in the z-direction toward the substrate from its drain end to its source end.

In particular, example configurations, including those described herein, drain ends of channel element groups are electrically coupled to drain ends of their associated channels. Accordingly, the bit lines are electrically connected or coupled to drain ends of channels and associated channel elements groups. In this context, a bit line or channel voltage that a bit line is configured to apply is a drain voltage, a drain-side channel voltage, or a drain-side voltage that the bit line applies to drain ends of channels and associated channel element groups to which the bit line is coupled. Otherwise stated, a drain-side channel voltage (or drain-side voltage) is a voltage that a bit line generates and applies to a drain end (or drain side) of a channel and/or a drain end (or drain side) of a channel element group to which it is electrically connected or coupled. During at least some example memory operations, a bit line may bias one or more drain terminals of one or more bias elements by applying a bit line voltage (or a drain voltage, a drain-side channel voltage, or a drain-side voltage) to one or more drain ends of one or more channels and/or to one or more drain ends of one or more channel element groups to which it the bit line is electrically connected or coupled. Otherwise stated, during at least some example memory operations, a bit line biases one or more drain terminals of one or more bias elements with a bit line voltage (or a drain voltage, a drain-side channel voltage, or a drain-side voltage) by way of the drain ends of one or more channels and/or the drain ends of one or more channel element groups to which the bit line is coupled.

Similarly, in particular example configurations, including those described herein, source ends of channel element groups are electrically coupled to source ends of their associated channels. Accordingly, the source line is electrically connected or coupled to source ends of channels and associated channel elements groups. In this context, a source line or channel voltage that a source line is configured to apply is a source voltage, a source-side channel voltage, or a source-side voltage that the source line applies to source ends of channels and associated channel element groups to which the source line is coupled. Otherwise stated, a source-side channel voltage (or source-side voltage) is a voltage that a source line generates and that it applies to a source end (or source side) of a channel and/or a source end (or source side) of a channel element group to which the source line is electrically connected or coupled. During at least some example memory operations, a source line may bias one or more source terminals of one or more bias elements by applying a source line voltage (or a source voltage, a source-side channel voltage, or a source-side voltage) to one or more source ends of one or more channels and/or to one or more source ends of one or more channel element groups to which it the source line is electrically connected or coupled. Otherwise stated, during at least some example memory operations, a source line biases one or more source terminals of one or more bias elements with a source line voltage (or a source voltage, a source-side channel voltage, or a source-side voltage) by way of the source ends of one or more channels and/or the source ends of one or more channel element groups to which the source line is coupled.

In addition, bias elements of a channel element group extend in the z-direction around or about the same channel. Each bias element of the channel element group is disposed coplanar with one of the plurality of control gate layers of the block. In this regard, each control gate layer of the block is configured to bias a control gate of a respective one of the plurality of bias elements of the channel element group.

In addition, for at least some example configurations, the channel element groups of a block may have the same number of bias elements, the same combination of bias element types, and the same number of bias elements of each bias element type. In addition, a bias element order in which the bias elements of their respective bias element types extend in the z-direction away from the substrate is the same among the channel element groups of a block. At least for some example configurations of 3-D NAND technology, the bias element order of the bias elements of a channel element group, starting closest to the substrate and moving away from the substrate in the z-direction, includes one or more SGS transistors followed by one or more source-side dummy cells, followed by a plurality of memory cells, followed by one or more drain-side dummy cells, and followed by one or more SGD transistors. Other bias element orders may be possible.

A control gate layer order of the control gate layers and their respective types may match or correspond to the bias element order of a block. Accordingly, at least for some example configurations of 3-D NAND technology, a control gate layer order of a plurality of control gate layers of a block, starting closest to the substrate and moving away from the substrate in the z-direction, includes one or more SGS layers, followed by one or more source-side dummy word line layers, followed by a plurality of word line layers, followed by one or more drain-side dummy word line layers, and followed by one or more SGD layers.

Figure 4B:
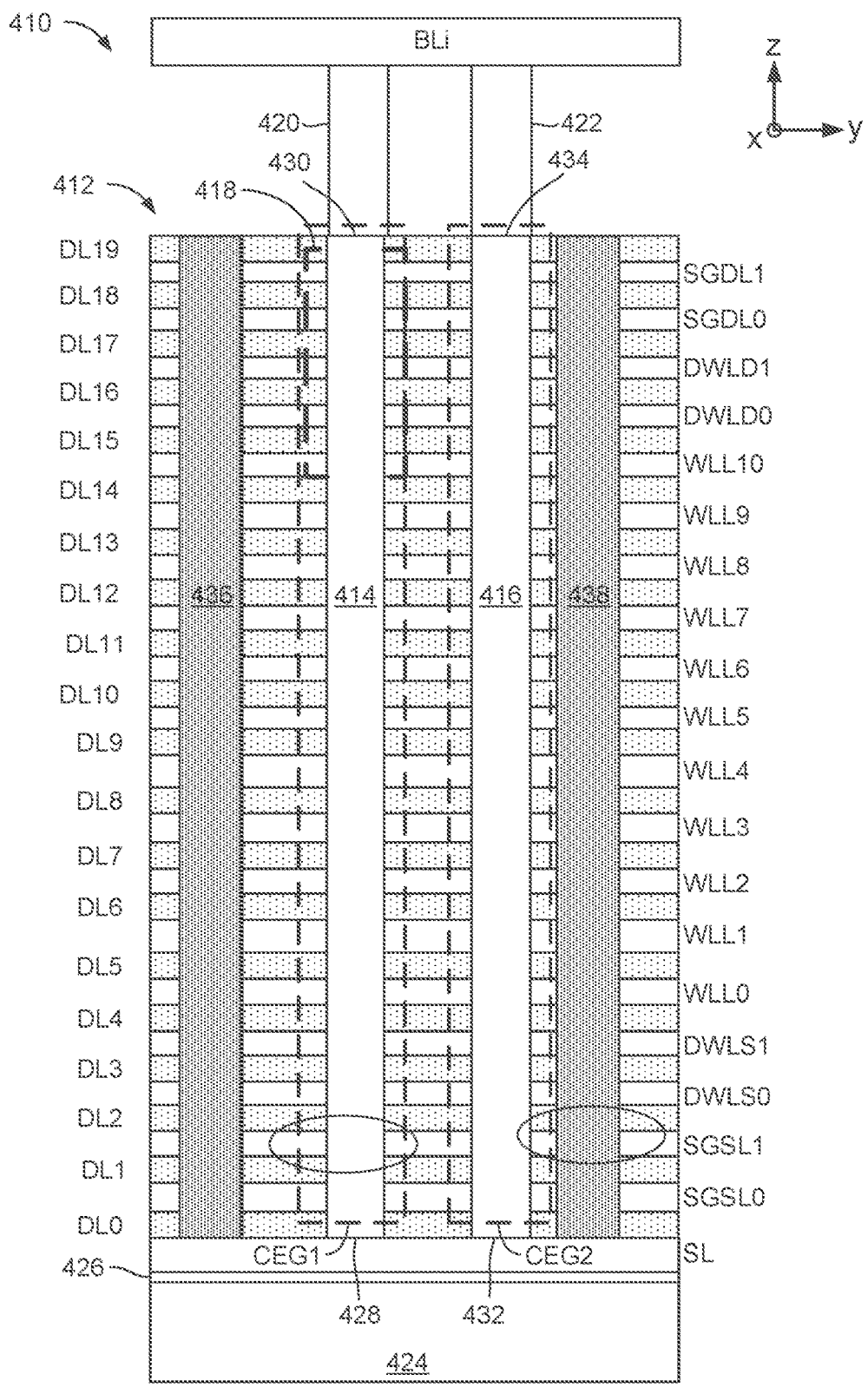
FIG. 4B generally illustrates a cross-sectional view of a portion of one of the blocks of FIG. 4A.

In further detail, FIG. 4B generally illustrates a cross-sectional view of a portion of a block 410, which may be representative of one of the blocks 400 of FIG. 4A. The block 410 includes a stack 412 of alternating control gate layers and dielectric layers (DL). In addition, the portion generally illustrated in FIG. 4B includes two channels (or memory holes) extending through the layers, including a first channel 414 and a second channel 416. Bias elements forming two memory channel element groups around the two channels 414, 416 are identified by dotted boxes in FIG. 4B. In particular, bias elements forming a first channel element group CEG1 around the first channel 414 are identified by a dotted box labeled CEG1, and bias elements forming a second channel element group CEG2 around the second memory hole 416 are identified by a dotted box labeled CEG2. Further details of bias elements and example materials to form the elements and the channels are described in further detail below with respect to FIG. 4C with reference to a particular region 418 of the first channel element group CEG1 and associated first channel 414.

For purposes of illustration, in FIG. 4B, the first and second channel element groups CEG1, CEG2 formed around the first and second channels 414, 416 are both electrically connected to an ith bit line BLi. In actual implementation, a block may include hundreds or thousands of bit lines. An arrangement of channels and associated channel element groups of a block may determine which channels and channel element groups are electrically connected to which bit lines. Among the plurality of channels and channel element groups of a block, certain combinations of channels and associated channel element groups are electrically connected to the same bit line as each other, while certain other combinations of channels and associated channel element groups are electrically connected to different bit lines from each other.

In addition, a given channel element group may be electrically connected to a given bit line by way of its associated channel and a conductive via electrically connecting the associated channel with the bit line. For example, in FIG. 4B, the first channel element group CEG1 is electrically connected to the ith bit line BLi by way of the first channel 414 and a conductive via 420 that electrically connects the first channel 414 with the ith bit line BLi. The second channel element group CEG2 is electrically connected to the ith bit line BLi by way of the second channel 416 and a conductive via 422 that electrically connects the second channel 416 with the ith bit line BLi. Other ways of electrically connecting bit lines with channel element groups may be possible.

The block 410 may further include or be disposed on a substrate 424. An insulating film 426 may be formed on the substrate 424, and a source line SL may be formed or disposed on a bottom-most layer of the stack 412.

In addition, in the example configuration generally illustrated in FIG. 4B, each channel 414, 416 includes a source end connected to the source line SL, and a drain end connected to its associated conductive via. In FIG. 4B, the first channel 414 includes a source end 428 connected to the source line SL, and a drain end 430 connected to the conductive via 420. Similarly, the second channel 416 includes a source end 432 connected to the source line SL, and a drain end 434 connected to the conductive via 422.

In addition, at least some example configurations, the block 410 may further include vertical interconnects (e.g., metal-filled slits) extending through the stack 412 that connect the source line SL to a conductive line above the stack 412, such as a conductive line in one of the metal layers in the upper region 408 (FIG. 4A). For purposes of illustration, FIG. 4B generally illustrates two interconnects 436, 438 extending through the stack 412.

In addition, in the example configuration in FIG. 4B, for purposes of illustration, each of the channel element groups include two SGS transistors, two source-side dummy cells, eleven memory cells, two drain-side dummy cells, and two SGD transistors. Accordingly, the control gate layers of the stack 412 include: two SGS layers, including a first SGS layer SGSL0 and a second SGS layer SGSL1; two source-side dummy word line layers, including a first source-side dummy word line layer DWLS0 and a second source-side dummy word line layer DWLS1; eleven word line layers extending from a first word line layer WLL0 to an eleventh word line layer WLL10; two drain-side dummy word line layers, including a first drain-side dummy word line layer DWLD0 and a second drain-side dummy word line layer DWLD1; and two SGD layers, including a first SGD layer SGS0 and a second SGD layer SGDL1. The stack further includes twenty dielectric layers, extending from a first dielectric layer DL0 to a twentieth dielectric layer DL19, alternatingly disposed between the control gate layers.

The numbers of bias elements and their respective bias element types used for the channel element groups and the number of corresponding control gate layers in the example configuration of the block 410 in FIG. 4B are non-limiting and merely exemplary for purposes of illustration. Other numbers of bias elements for any of the bias element types, or other configurations that do not include bias elements of certain bias elements types or that include one or more bias elements of bias element types other than those generally illustrated in FIG. 4B, may be possible.

Figure 4C:
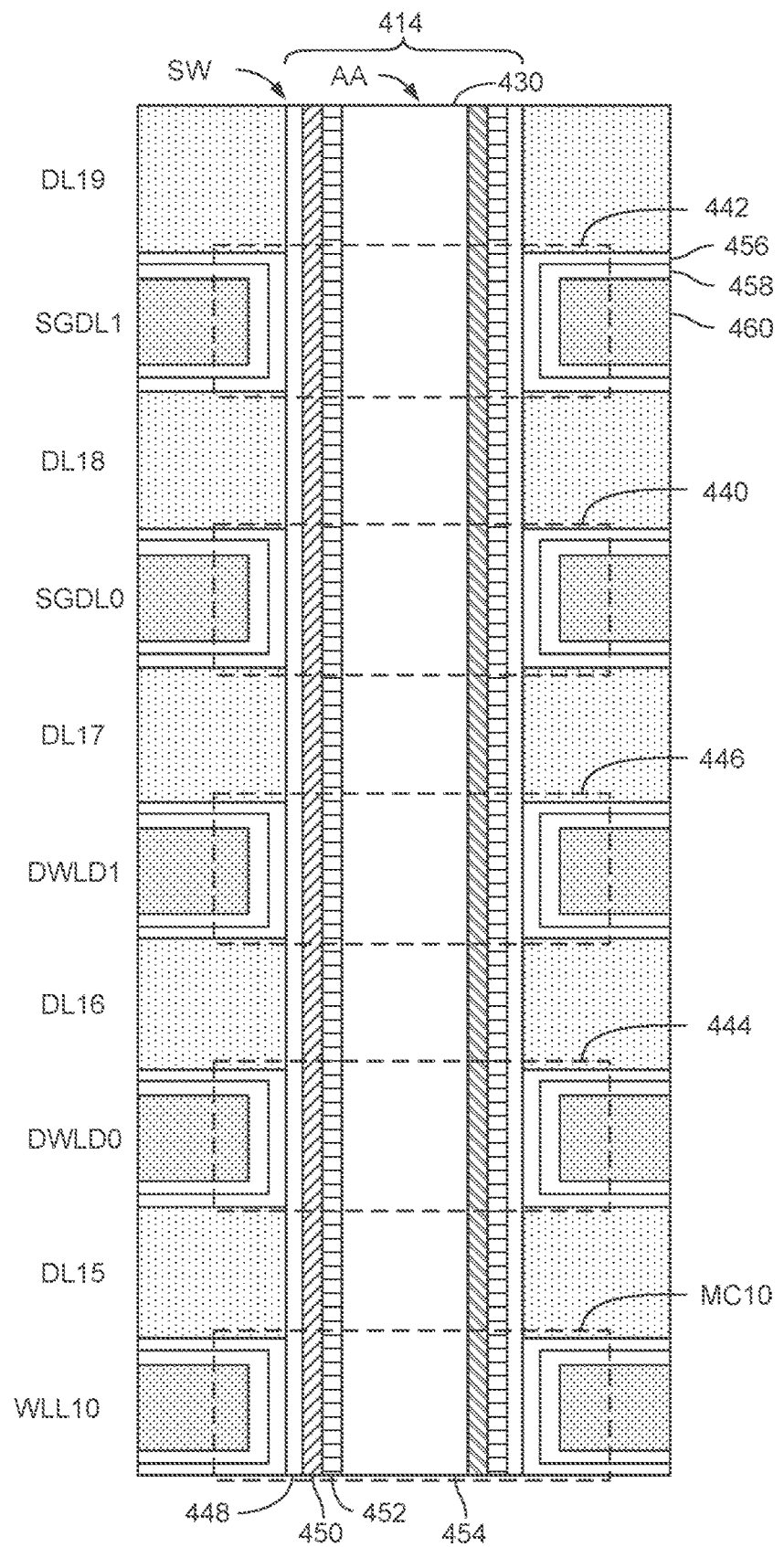
FIG. 4C generally illustrates a close-up view of a region of the cross-section of FIG. 4B.

FIG. 4C is a close-up view of the region 418 of the block 410 of FIG. 4B. The materials forming the bias elements are formed at different levels of the stack 412 at the intersection of respective control gate layers and respective channels. In the example configuration of the block 410, as depicted in the close-up view of FIG. 4C, a first SGD transistor 440 and a second SGD transistor 442 are disposed below the drain end 430 of the first channel 414, and above first and second drain-side dummy cells 444, 446 and an eleventh memory cell MC10.

Physically or structurally, a channel includes a memory hole extending in the z-direction defined by a sidewall (SW). A channel further includes one or more layers of materials disposed in the memory hole and/or on the sidewall, such as by using atomic layer deposition as an example. In some example configurations, as described with respect to the first channel 414, the layers of materials of a channel (which may be referred to as a column or a pillar of materials) may include a charge-trapping layer or film 448 such as silicon nitride, a tunneling layer 450, a polysilicon body or channel 452, and a dielectric core 454. In addition, in some example configurations, such as the one generally illustrated in FIG. 4C, the materials making up each of the bias elements may include a blocking oxide/block high-k material 456, a barrier metal 458, and a conductive metal 460 (e.g. Tungsten) that forms the control gates of the transistors. The materials forming the bias elements may be disposed in the same level or in the same plane as the respective control gate layers. Other configurations may use materials deposited along the sidewall (SW) and/or for the bias elements other than those generally illustrated and described with reference to FIG. 4C.

Figure 4D:
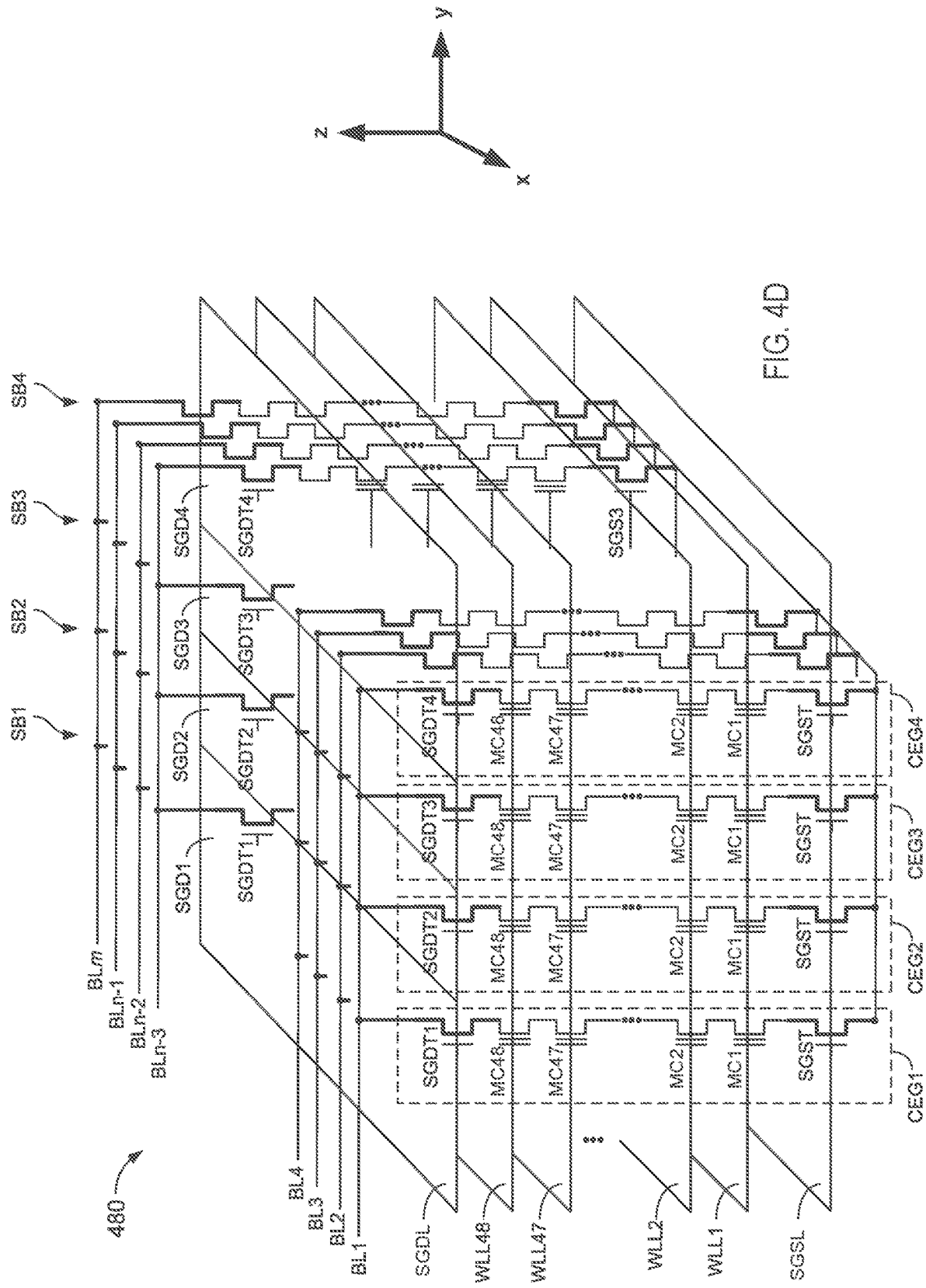
FIG. 4D generally illustrates a circuit schematic diagram of a block of memory cells three-dimensionally arranged into a plurality of NAND strings.

FIG. 4D generally illustrates a circuit schematic diagram of an example configuration of a three-dimensional block 480, which may be representative of at least a portion of one of the blocks 400 of FIG. 4A and/or have the physical construction or structure as depicted in FIGS. 4B, 4C. In FIG. 4D, each bias element is represented or depicted as a transistor. In addition, memory cells are labeled MC, SGD transistors are labeled SGDT, and SGS transistors are labeled SGST. In the example block 480, each channel element group (e.g., CEG1) includes 50 cells, including 48 memory cells, extending from a first memory cell MC1 to a 48th memory cell MC48, one SGD transistor SGDT, and one SGS transistor SGST. Other channel element group configurations are possible, including those that include one or more source-side dummy cells, one or more drain-side dummy cells, more than one SGD transistor, and/or more than one SGS transistor, as previously described.

In accordance with the channel element group configuration in FIG. 4B, the block 480 includes 50 control gate layers, including 48 word line layers extending from a first word line layer WLL1 to a 48th word line layer WLL48, a SGD layer SGDL, and a SGS layer SGSL. As previously described, the ith memory cells MCi in each channel element group are disposed in and configured to have their respective control gates biased by the ith word line layer WLLi of the control gate layers. As examples, first memory cells MC1 of the channel element groups CEG are disposed in and configured to have their control gates biased by the first word line layer WLL1, the second memory cells MC2 are disposed in and configured to have their control gates biased by the second word line layer WLL2, and the 48th memory cells MC48 of the channel element groups CEG are disposed in and configured to have their control gates biased by the 48th word line layer WLL48. In addition, the SGD transistors of the channel element groups are disposed in and configured to have their respective control gates biased by the SGD layer SGDL, and the SGS transistors of the channel element groups are disposed in and configured to have their respective control gates biased by the SGS layer SGSL.

As depicted in FIG. 4D, the channel element groups CEG and their associated channels are two-dimensionally arranged in the x and y directions in the block 480, and electrically connected to an m-number of bit lines. In particular example configurations, the channel element groups CEG and their associated channels are two-dimensionally arranged in accordance with a channel arrangement that depends on a P-number of channel element groups and their associated channels that are connected to a single bit line. Otherwise stated, each bit line BL is configured to electrically connect to, apply a respective bit line voltage to, and/or bias with a respective bit line (channel) voltage, a unique set of a P-number of channel element groups and their associated channels.

In the example configuration of FIG. 4D, each bit line BL is configured to electrically connected to four channel element groups (i.e., P=4). Accordingly, FIG. 4D generally illustrates the first bit line BL1 electrically connected to each of a first channel element group CEG1, a second channel element group CEG2, a third channel element group CEG3, and a fourth channel element group CEG4. Each of the other two through mth bit lines BL2 to BLm are also electrically connected to a respective set of four channel element groups and their respective channels. Numbers for P other than four may be possible for various other configurations.

In addition, for some example embodiments, the memory system 100 may group the m-number of bit lines BL1 to BLm into groups of bit lines. A bit line group, also referred to as a bit line column, is a collection or a plurality of bit lines recognized or identified collectively in the memory system 100. The bit lines of a bit line group may be part of a same block. In particular example embodiments, the bit lines of a bit line group are adjacent bit lines. Grouping the bit lines into bit line groups or columns may reduce the complexity of addressing the storage locations of the memory cell structure 142 in that a column address over a page may be identified on the basis of groups of bit lines, rather than on a bit line-by-bit line basis. In one example, a block may include 16,000 bit lines (i.e., m=16,000), and every sixteen bit lines BL are grouped together in a bit line group or column. Grouping the 16,000 bit lines BLs into bit line groups or columns of sixteen may yield only 1,000 column addresses over a page, rather than 16,000 column addresses.

In addition, in some example configurations, an SGD layer may be separated or divided into a plurality of different drain select gate (SGD) sub-layers that are electrically isolated or disconnected from each other. For example, an SGD layer may be etched to remove portions of the metal forming the SGD layer in order to form a plurality of electrically isolated or disconnected SGD sub-layers.

Different SGD sub-layers of the same SGD layer may be independently and/or individually biased and/or supplied with a different one of a plurality of SGD line voltages. In turn, for a given plurality of SGD transistors disposed in the same SGD layer, each SGD sub-layer of the same SGD layer may be configured to bias the control gates of those SGD transistors disposed in its SGD sub-layer, but not the SGD transistors disposed in the other SGD sub-layers. In this way, the plurality of SGD sub-layers may be configured to independently or individually bias the different SGD transistors within their respective SGD sub-layers with a respective one of a plurality of SGD line voltages.

In addition, for example configurations that include multiple SGD layers, each SGD layer may include multiple SGD sub-layers. The number of SGD sub-layers in each SGD layer may be the same. In addition, certain combinations of SGD-sub-layers in different SGD layers may be electrically coupled and/or supplied with the same SGD line voltage such that SGD transistors of the same channel element group have their control gates biased with the same SGD line voltage. SGD sub-layers that bias SGD transistors with the same SGD line voltage form part of the same SGD line.

As used herein, an SGD line is a conductive structure of a block that biases control gates of SGD transistors with a common or the same SGD line voltage. Accordingly, as used specifically herein for SGD layers and SGD lines, the terms "line" and "layer" are not used interchangeably. Instead, an SGD line is a single SGD sub-layer, or a collection of SGD sub-layers each part of a different SGD layer. In particular, for 3-D block configurations that include a single SGD layer, each SGD sub-layer of the SGD layer forms an entire SGD line. For 3-D block configurations that include multiple SGD layers, each SGD sub-layer forms a part of an SGD line with one or more other SGD sub-layers from one or more other SGD layers.

In addition, different SGD lines are configured to independently or separately bias different sets or groups of SGD transistors of a block with different SGD line voltages. An SGD line is configured to bias the control gates of those SGD transistors to which it is coupled or electrically connected, and not bias the control gates of those SGD transistors from which it is uncoupled or electrically disconnected. Accordingly, the SGD transistors SGDT of a block are arranged or formed into a plurality of SGDT groups. SGD transistors that are part of the same SGDT group are coupled to the same SGD line and configured to be biased by the same SGD line voltage. SGD transistors that are part of different SGDT groups are coupled to different SGD lines and configured to be biased by different SGD line voltages.

In addition, for at least some example configurations of a 3-D block, the number of SGD lines is equal to the P-number of channel element groups and associated channels that are connected to the same bit line. For example, with reference to FIG. 4D, the block 480 includes four SGD lines corresponding to the four channel element groups connected to a single bit line, including a first SGD line SGD1, a second SGD line SGD2, a third SGD line SGD3, and a fourth SGD line SGD4. Otherwise stated, the SGD layer SGDL includes four SGD lines SGD1, SGD2, SGD3, and SGD4.

In addition, the channel element groups may be arranged so that for a given set of channel element groups connected to the same bit line, each channel element group of the set has its SGD transistor SGDT coupled to a different one of the SGD lines. For example, in the block 480 of FIG. 4D, the set of four channel element groups CEG1, CEG2, CEG3, CEG4 connected to the first bit line BL1 have their respective SGD transistors connected to a different one the SGD lines SGD1, SGD2, SGD3, SGD4. In particular, the first channel element group CEG1 includes an SGD transistor SGDT1 coupled to and configured to have its control gate biased by the first SGD line SGD1, the second channel element group CEG2 includes an SGD transistor SGDT2 coupled to and configured to have its control gate biased by the second SGD line SGD2, the third channel element group CEG3 includes an SGD transistor SGDT3 coupled to and configured to have its control gate biased by the third SGD line SGD3, and the fourth channel element group CEG4 includes an SGD transistor SGDT4 coupled to and configured to have its control gate biased by the fourth SGD line SGD4.

A 3-D block may be arranged, organized, or divided into sub-blocks across the m-number of word lines based on the different SGD lines. As used herein, a sub-block is a portion of a block that has channel element groups with SGD transistors configured to be biased by the same SGD line and/or with the same SGD line voltage. A sub-block may span, such as in the x-direction, across the m-number of word lines of a block. In addition, channel element groups with SGD transistors configured to be biased by different SGD lines and/or with different SGD line voltages are part of different sub-blocks.

The number of sub-blocks of a block may be equal to the number of SGD lines. For example, the example block 480 of FIG. 4D includes four sub-blocks (SB) equal to the number of SGD lines, including a first sub-block SB1, a second sub-block SB2, a third sub-block SB3, and a fourth sub-block SB4. The first sub-block SB1 includes those channel element groups with SGD transistors SGD1 coupled to the first SGD line SGD1 and configured to be biased with a first SGD line voltage, the second sub-block SB2 includes those channel element groups with SGD cells SGD2 coupled to the second SGD line and configured to be biased with a second SGD line voltage, the third sub-block SB3 includes those channel element groups with SGD cells SGD3 coupled to the third SGD line and configured to be biased with a third SGD line voltage, and the fourth sub-block SB4 includes those channel element groups with SGD cells SGD4 coupled to the fourth SGD line and configured to be biased with a fourth SGD line voltage.

In addition, a block of memory cells (i.e., memory cells that are part of the same block), may be arranged, organized, separated, and/or labeled on a sub-block level, or on both a sub-block level and a word line level. A plurality of memory cells MC that are part of the same sub-block is referred to as a sub-block of memory cells. Otherwise stated, a sub-block of memory cells are memory cells of channel element groups having SGD cells coupled to the same SGD line and/or configured to be biased with the same SGD line voltage.

In addition, a plurality of memory cells that are part of the same sub-block, and that are also disposed in the same word line layer and/or that are configured to have their control gates biased by the same word line and/or with the same word line voltage are referred to as a word line cell group or a string of memory cells. Otherwise stated, a word line cell group (or string) of memory cells is a plurality or a collection of memory cells coupled to the same word line layer, and that are part of channel element groups configured to be biased with the same SGD line voltage.

A single word line layer may include a plurality of word line cell groups, such that the memory cells disposed in a single word line layer are organized, arranged, or disposed into a plurality of word line cell groups (or strings). Memory cells coupled to the same word line layer but that are part of channel element groups having SGD transistors coupled to different SGD lines are part of different word line cell groups. In particular example configurations, the number of word line cell groups coupled to a single word line layer is equal to the number of SGD lines of a block. In addition, the number of memory cells of a single word line cell group may be equal to the m-number of bit lines BL1 to BLm, such that each memory cell of a word line cell group is electrically connected to a different one of the m-number of bit lines BL1 to BLm.

In addition, the memory cells of a block, or of the memory cell structure 142 generally, are configured to store data as bits or binary digits, with each bit having either a logic 0 or a logic 1 binary value. A single memory cell may be configured to store either a single bit or a plurality of bits. A bit or bits that a single memory cell stores is referred to as a data value. Otherwise stated, a data value is an n-bit binary value that a single memory cell stores, where n is the number of bits of the binary value, and where the number n is one or more. The number of possible data values that a single memory cell can store depends on the n-number of bits it is configured to store. In particular, the number of possible data values a single memory cell can store is $2^n$.

Memory cells may be referred to as single-level cells or multi-level cells depending on the number of bits they are configured to store. A single-level cell, referred to as a SLC cell (or just SLC), is a memory cell configured to store a single or one bit of data. A multi-level cell, referred to as a MLC cell (or just MLC), is a memory cell configured to store multiple (i.e., two or more) bits of data. Example numbers of bits that an MLC cell can store include 2, 3, or 4, although MLC cells that store more than 4 bits may be possible.

In general, certain collections of memory cells are configured to store the same number of bits. For example, memory cells that are part of the same word line cell group, part of the same block, or part of the same memory cell structure 142, are configured to store the same number of bits. In this context, a given collection of memory cells (e.g., memory cells of the same word line cell group, the same block, the same memory cell structure, etc.) stores data on a bits-per-cell basis. Each memory cell of the given collection stores the same number of bits-per-cell.

In addition, a memory cell structure 142, including blocks and word line cell groups of the memory cell structure 142, may store data as pages. Herein, a page is a single unit of data that a single word line cell group of memory cells stores. The number of pages that a single word line cell group stores depends on the number of bits-per-cell that the memory cells of the single word line cell group are configured to store. As examples, a word line cell group of SLC cells is configured to store a single or one page of data; a word line cell group of MLC cells configured to store two-bits-per-cell is configured to store two pages of data; and a word line cell group of MLC cells configured to store three-bits-per-cell is configured to store three pages of data.

In addition, a memory cell structure 142 may store data according to one or more storage schemes. As used herein, a storage scheme is a general plan including a predefined set of actions and a predefined set of parameters that a memory system implements to store data. A given storage scheme for a particular collection of memory cells may identify or define the number of bits-per-cell that the memory cells of the particular collection are configured to store. The components of the memory system, including the circuit components on a given memory die, are configured to perform memory operations on the particular collection in accordance with the given storage scheme in order to program data into and/or read data from the particular collection of memory cells.

Memory cells of different memory technologies may store data in accordance with different storages schemes. In addition, memory cells of the same memory technology may store data in accordance with different storage schemes. For example, memory cells of the same memory technology but located in different memory systems, or in the same memory system but in different memory dies, or in different blocks or planes of the same memory die, or even different word line layers or different word line cell groups of the same block, may store data in accordance with different storage schemes, at least with respect to the number of bits-per-cell the different memory cells are configured to store.

At least for NAND memory technology, the NAND memory cells may be configured to store data in accordance with one of multiple different storage schemes, with each storage scheme associated or identifying a different number of bits-per-cell. In at least some example configurations, some NAND memory cells may store data according to one storage scheme while other NAND memory cells store data according to a different storage scheme. Accordingly, two different collections of NAND memory cells located in different memory systems, or in the same memory system but in different dies, planes, blocks, word line layers, or word line cell groups, may store different numbers of bits-per-cell according to different storage schemes. To illustrate, one collection of NAND memory cells may be configured as SLC cells and another collection of NAND memory cells may be configured as MLC cells.

In addition, the same memory cell (or the same collection of memory cells) may be configured to store different numbers of bits-per-cell according to different storage schemes at different times. To illustrate, in one example, a memory cell may be configured as an SLC cell at one point in time, and then reconfigured as an MLC cell at a later point in time. As another example, a memory cell may be configured as an MLC cell at one point in time, and then reconfigured as an SLC cell at a later point in time. As another example, a memory cell may be configured as an MLC cell storing a first number of bits-per-cell at one point in time, and then reconfigured as an MLC cell storing a second number of bits-per-cell at a later point in time, where the first and second numbers are different from each other, with the first number being either less than or greater than the second number.

In addition, a memory cell stores data by having an associated storage parameter (alternatively or otherwise referred to as a characteristic, property, or feature) set to a level, value, magnitude, or state. The associated parameter is adjustable or variable, and can be controlled by biasing the control lines coupled to the memory cells at certain levels, at certain times, during certain memory operations, and according to certain storage schemes. Within one storage scheme defining a set of data values, a memory cell can store data at a certain one of the data values by having its storage parameter set to a level, value, magnitude, or state, or within a predetermined range of levels, values, magnitudes, or states. The level, value, magnitude, or state that the memory cell is at or set to corresponds to the data value of the set that the memory cell is storing. In addition, the memory cell can be configured to store a different value, or to change the data value of the data it is storing from one data value to another data value, by changing or adjusting the storage parameter to a different level, value, magnitude, or state.

The storage parameter that a memory cell has to store data depends on the memory technology, and can vary across different memory technologies. For NAND technology, the storage parameter is threshold voltage. At least with respect to NAND memory cells, a threshold voltage of a memory cell is a voltage applied to a control gate of the memory cell at which the memory cell becomes conductive. The level (otherwise referred to as the value or magnitude) of the threshold voltage depends on or is proportional to the amount of electrical charge that the memory cell is storing or trapping. The more charge that a memory cell is storing, the higher its threshold voltage, and the less charge that a memory cell is storing, the lower its threshold voltage. Accordingly, the data value that the memory cell is storing is set by setting the threshold voltage of the memory cell to a certain level, and the data value is adjusted or changed by changing the threshold voltage to a different level or within a different range of levels.

In addition, for NAND technology, the memory cells store data by being configured in memory states. As used herein, a memory state is an identifier that identifies a data value of data that a memory cell is storing, can store, or is intended to store. A storage scheme identifies or defines an associated plurality or set of memory states at which a memory cell can be configured. Each memory state identifies, corresponds to, and/or is associated with one of the plurality of data values identified or defined by the storage scheme. Accordingly, a memory cell configured in a given memory state is storing a data value that corresponds to the given memory state. A memory cell can store a different data value by being configured into a different memory state.

For a given storage scheme, the memory states include an erased state and one or more program states. An erased state is a memory state in which a memory cell is configured when erased. For at least some example configurations, the erased state is the memory state that all of a collection of memory cells are in at the start of a program operation to program at least some of the memory cells of the collection. A program state is a memory state that a memory cell is in upon being subjected to a program operation. At a given point in time, a memory cell may be in the erased state or one of the program states.

In addition, for a given storage scheme, each memory state has, corresponds to, or is associated with an associated range of threshold voltage levels, with each range being bounded by an upper threshold voltage level and a lower threshold voltage level. Otherwise stated, a given storage scheme may define a plurality of non-overlapping threshold voltage ranges, with each range being associated with or corresponding to a respective one of the plurality of memory states defined or identified by the given storage scheme. In turn, each range has, corresponds to, or is associated with a respective one of the data values. In this way, a storage scheme establishes a one-to-one correspondence between the threshold voltage ranges, the memory states, and the data values. Memory cells are programmed and read according to the one-to-one correspondence. That is, a memory cell configured with a threshold voltage level within a given threshold voltage range is configured in the memory state associated with the given threshold voltage range, and in turn is storing data having a data value that is associated with the given threshold voltage range and the corresponding memory state.

For particular embodiments, the erased state is associated with the lowest threshold voltage range. The program states are associated with consecutively or sequentially higher threshold voltage ranges from the range associated with the erased state.

In addition, the storage schemes may label or name the memory states in any of various ways, including alphabetically, numerically, or alphanumerically, as non-limiting examples. In particular example configurations, the erased state is called the erased state, and the program states are named with letters, numbers, or a combination thereof by associating higher letters in the alphabet or higher numbers with higher threshold voltage ranges. As illustrations, a memory state C is associated with a higher threshold voltage range than a memory state A, and a memory state 8 is associated with a higher threshold voltage range than a memory state 1. Various ways of labeling or naming memory states are possible.

In addition, memory states may be referred to as being higher memory states and lower memory states relative to each other. A first memory state is a higher memory state than a second memory state where the first memory state is associated with a higher threshold voltage range than the threshold voltage range with which the second memory state is associated. In addition, a first memory state is a lower memory state than a second memory state where the first memory state is associated with a lower threshold voltage range than the threshold voltage range with which the second memory state is associated.

In addition, the way in which the data values correspond to the memory states and/or the threshold voltage ranges may vary, and in particular, embodiments, how the data values correspond to or are assigned to the memory states and/or threshold voltage ranges may depend on a particular code scheme, such as the Gray code scheme, for example.

In implementation, a collection of memory cells programmed into the same memory state may have an associated collection of threshold voltage as a result of the programming. The threshold voltages may be represented as a threshold voltage probability distribution, or just threshold distribution of the number of memory cell in the collection as a function of threshold voltage.

A given storage scheme may have a model, reference, ideal, or target threshold voltage distribution, which may be in the form of a continuous probability distribution, such as a Gaussian distribution, for example, for each of the memory states and associated threshold voltage ranges defined by the given storage scheme. A model threshold voltage distribution may represent a model of an ideal threshold voltage distribution for a collection of memory cells programmed into the same memory state to have. The lower and upper tails of the model threshold voltage distributions may align or correspond to the upper and lower threshold voltage levels of the ranges with which each of the model threshold voltage distributions is associated.

Referring back to FIG. 2B, the memory die 104 may further include a read/write circuit 144 that includes a plurality or a p-number of sense blocks (also referred to as sense modules or sense systems) 146. As described in further detail below, the sense blocks 146 are configured to participate in reading data from or programming data into word line cell groups of memory cells in parallel.

The memory die 104 may also include a row address decoder (or just row decoder) 148 and a column address decoder (or just column decoder) 150. The row decoder 148, which may also be referred to as a word line decoder, an x decoder, or an x-wire decoder, may decode a row address (also referred to as a word line address or an x address), and select a particular word line in the memory cell structure 142 corresponding to and/or identified by the decoded row address when reading data from or programming/writing data into to the memory cell structure 142. The column decoder 150, which may also be referred to as a bit line decoder, a y decoder, or a y-wire decoder, may decode a column address (also referred to as a bit line address or a y address), and select a particular bit line or group of bit lines in the memory cell structure 142 corresponding to and/or identified by the column address, when reading data from or programming data to the memory cell structure 142.

In addition, the non-volatile memory die 104 may include a peripheral circuit 152. The peripheral circuit 152 may include a control logic circuit (also referred to as a control logic, an on-chip controller, or an on-die controller) 154, which, at least in some example embodiments, may be implemented as a state machine, that is configured to control on-chip memory operations as well as send status information to the controller 102. The peripheral circuit 152 may also include an on-chip address decoder 156 that provides an address interface between addressing used by the controller 102 and/or a host and the addressing used by the row and column decoders 148, 150. In addition, the peripheral circuit 152 may include volatile memory 158. An example configuration of the volatile memory 158 may include latches, although other configurations are possible.

In addition, the peripheral circuit 152 may include a power control circuit 160 that is configured to generate and supply control line voltages (including voltage pulses) to control lines of the memory cell structure 142. The control line voltages include control gate line voltages supplied to control gate layers, bit line voltages supplied to bit lines, and supply line voltages supplied to supply lines. The control gate line voltages include word line voltages supplied to the word lines, drain select gate line voltages (SGD line voltages) supplied to the SGD lines, and source select gate line voltages (SGS line voltages) supplied to the SGS lines. The power control circuit 160 also be configured to generate and/or supply voltages other than the control lines voltages, including other voltages that may be supplied to the memory cell structure 142, the read/write circuits 144, the sense blocks 146, and/or other circuit components on the memory die 104.

The power control circuit 160 may include any of various circuit topologies or circuit configurations to generate and/or supply the voltages at appropriate levels to perform memory operations, (including read, program/write, sense, and erase operations), such as driver circuits, current sources, charge pumps, reference voltage generators, regulators, and pulse generation circuits, or any of various combinations thereof. Other types of circuits to generate the voltages may be possible. In addition, the power control circuit 160 may communicate with and/or be controlled by the control logic circuit 154, the read/write circuits 144, and/or the sense blocks 146 in order to supply the voltages at appropriate levels and at appropriate times to carry out the memory operations.

When the controller 102 determines to write (or program) data into the memory dies 104, the ECC module 124 first generates parity bits for the data during a parity bit generation process, also referred to as an encoding process. Parity bits are bits that the ECC module 124 uses during read operations to determine if bits read from the memory dies 104 have correct bit values, and uses the parity bits to correct bits that have incorrect bit values. Upon generating the parity bits, the ECC module 124 appends the parity bits to the data to form a codeword, and sends the codeword to the memory dies 104 for storage. In some embodiment, ECC module 124 may arrange the parity in any suitable order to form the codeword. In some embodiments, the ECC module 124 may omit the data to form the codeword.

Figure 5:
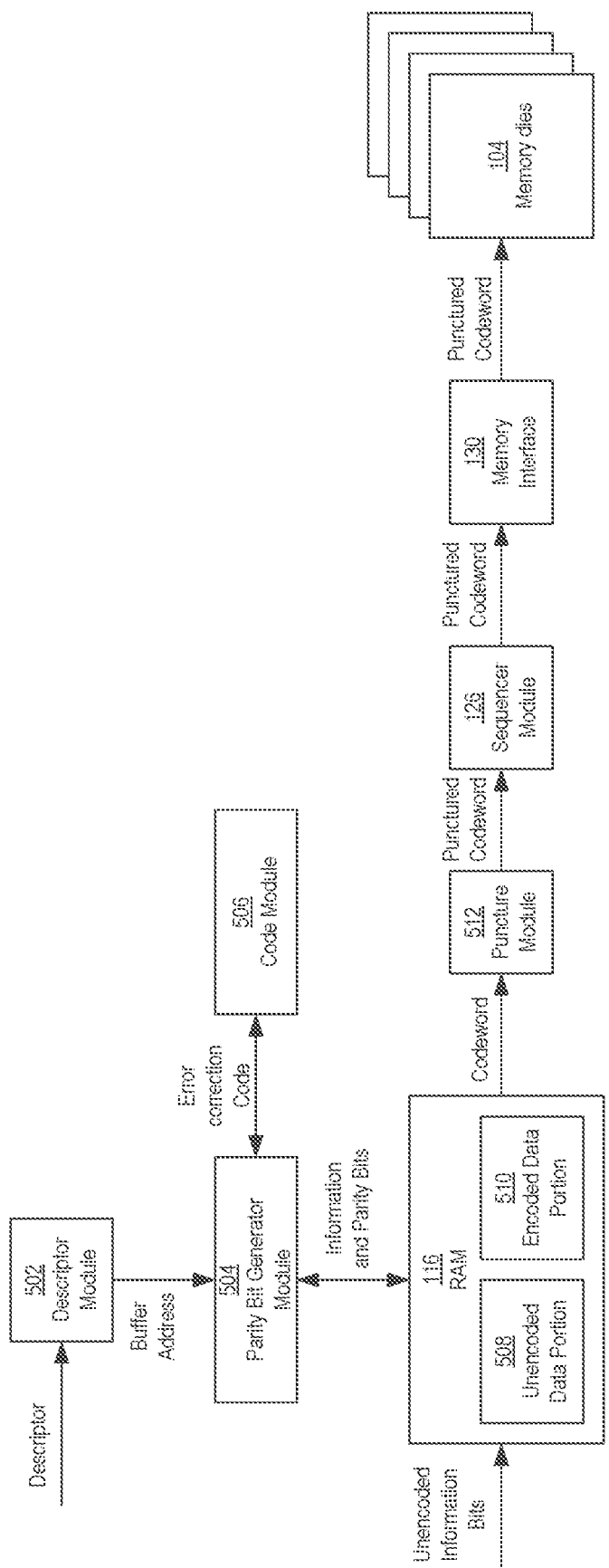
FIG. 5 generally illustrates a block diagram of example modules of the memory system used to perform a parity bit generation process.

FIG. 5 generally illustrates a block diagram of components of the memory system 100 that may be involved in a parity bit generation process of a program (or write) operation. The components may include a descriptor module 502, a parity bit generator module 504, and a code module 506. For particular example configurations, the components may be components of the ECC module 124 of the controller 102, although in other example configurations, some or all of these components may be considered components separate from the ECC module 124 and/or separate from the controller 102.

In general, the memory system 100 may store data in the memory dies 104 as codewords (also referred to as an ECC page or a flash memory unit, as previously described). Each codeword may include information data (bits) and parity data (bits). The information bits may include payload data (bits), which includes the data that the host wants written to and read from the memory dies 104. The information bits may also include header data (bits), which may include various information about the payload data, such as logical address information, the write source, when the data is written (timestamp), flag fields, reversion numbers, and scrambler seeds as non-limiting examples. The parity bit generator module 504 may generate parity bits during read operations in order to detect and correct errors of the header and payload portions of the data during an error correction process of a read operation to read the data from the memory die 104.

Prior to the parity bit generation, the front-end module 108 may load information bits to be written into the memory dies 104 in an unencoded data portion 508 of the RAM 116 in an unencoded or raw format. To initiate the parity bit generation process, the descriptor module 502 may be configured to receive a descriptor from the descriptor generator module 136 (FIG. 2A). The descriptor may identify that it is a descriptor for a write operation. In addition, the descriptor may identify the buffer address where the unencoded data is being stored in the unencoded data portion 508 of the RAM 116. The descriptor may also identify the physical address of a memory die 104 where the data is to be stored.

Upon receipt of the descriptor, the descriptor module 502 may provide the physical address where the data is to be stored in the memory die 104 to the parity bit generator module 504. The parity bit generator module 504 may retrieve the information bits in the encoded data portion 508 and generate the parity bits associated with the information bits.

The parity bit generator module 504 may be configured to generate the parity bits using an error correction code stored in the code module 506. In particular example configurations, the code module 506 includes memory storing one or more error correction codes. The memory may be a stand-alone memory component, or may be a part of any or a plurality of storage locations within the non-volatile memory system 100 (e.g., part of the RAM 116 or part of a memory die 104) and/or external to the non-volatile memory system 100. In some embodiments, the one or more error correction codes may be stored in the memory dies 104, and the controller 102 may be configured to load a copy of the one or more error correction codes into the code module 506, such as during initialization and/or when reading and/or writing data to a particular die 104.

In general, an error correction code is a data set that determines the parity bits (including the bit values of the parity bits) for a given set of information bits and/or an entire codeword. For at least some example configurations, an error correction code has a corresponding generator matrix of parity-check matrix which describes the code. In some example configurations, an error correction code stored in the code module 506 is a low-density parity-check (LDPC) error correction code having a corresponding LDPC matrix, also referred to as an LDPC parity-check matrix or just parity-check matrix H. The parity bit generator module 502 may be configured to generate the parity bits for a codeword such that following matrix equation is satisfied:

$$H\omega=0, \quad (1)$$

where H is the parity-check matrix and $\omega$ is the codeword including the information bits and the parity bits. In addition to generating parity bits, the parity bit generator module 504 may generate the codewords $\omega$, such as by appending the parity bits to the raw data (i.e., the information bits and/or the header bits). Additionally or alternatively, the parity bit generator module 504 may format the codeword $\omega$, such that the first J bits of the codeword $\omega$ are equal to an information bit sequence $\beta$ of the information bits, and the last K bits of the codeword $\omega$ are equal to the parity bit sequence $\delta$ of the parity bits. The parity bit generator module 504 may then generate the parity bits, such that the following equation is satisfied:

$$H \cdot \begin{bmatrix} \beta \\ \delta \end{bmatrix} = 0. \quad (2)$$

In some LDPC encoding schemes, the parity bit generator module 504 may generate the parity bit sequence $\delta$ by taking advantage of the sparse nature of the parity-check matrix H in accordance with LDPC.

Figure 6:
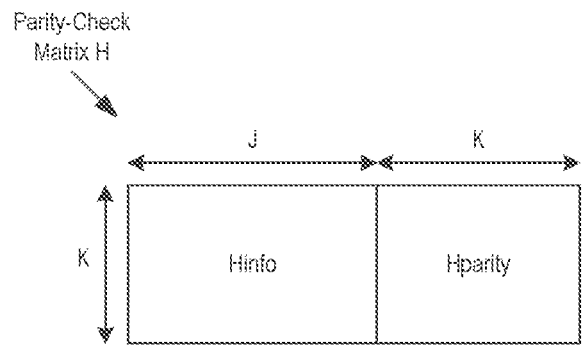
FIG. 6 generally illustrates a schematic diagram of a generic layout of a parity-check matrix.

FIG. 6 generally illustrates a schematic diagram of a generic layout of a parity-check matrix H. The parity-check matrix H may include a first submatrix $H_{info}$ and a second submatrix $H_{parity}$. The first submatrix $H_{info}$ may include a J-number of columns that is equal to a J-number of bits in the information bit sequence $\beta$. The second submatrix $H_{parity}$ may include a K-number of columns that is equal to the K-number of bits in the parity bit sequence $\delta$. Also, as generally illustrated in FIG. 6, each of the first submatrix $H_{info}$ and the second submatrix $H_{parity}$ include a K-number of rows equal to the K-number of bits in the parity bit sequence $\delta$.

Additionally or alternatively, the first submatrix $H_{info}$ and the second submatrix $H_{parity}$ are positioned relative to each other such that the last column of the first submatrix $H_{info}$ is adjacent to the first column of the second submatrix $H_{parity}$. In addition, the order of the rows are common amongst the first and second submatrices $H_{info}$, $H_{parity}$. In other words, the first row of the first submatrix $H_{info}$ forms a common row with the first row of the second submatrix $H_{parity}$, and so on. Further, the elements of the first and second submatrices $H_{info}$, $H_{parity}$ by J elements for the first submatrix $H_{info}$ and K-by-K elements for the second submatrix $H_{parity}$) may each include binary "0" and "1" values. The makeup of the 0 and 1 values may be in accordance with various encoding schemes, such as LDPC or Quasi-Cyclic (QC)-LDPC codes, as examples.

Figure 7:
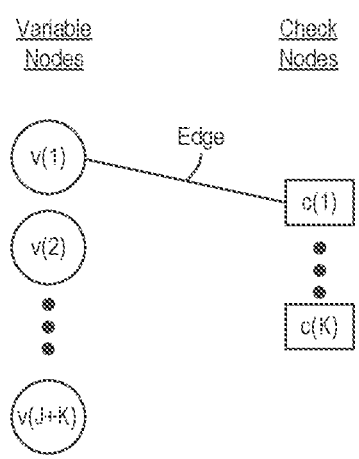
FIG. 7 generally illustrates a schematic diagram of a partially completed Tanner graph corresponding to the parity-check matrix of FIG. 6.

The parity-check matrix H may have a corresponding Tanner graph. FIG. 7 generally illustrates a schematic diagram of a partially completed Tanner graph corresponding to the parity-check matrix H of FIG. 6. In general, a Tanner graph may include variable nodes (or just variables), check nodes (or just checks), and edges connecting the check nodes and the variables nodes. The number of variable nodes may be equal to the number of columns in the parity-check matrix H and the number of bits in a codeword $\omega$. Accordingly, a Tanner graph may include a J+K number of variable nodes $v(1)$ to $v(J+K)$ corresponding to the J-number of bits in the information bit sequence $\beta$ and the K-number of parity bits of the parity bit sequence $\delta$. The number of check nodes may be equal to the number of rows in the parity-check matrix H and the number of parity bits in the parity bit sequence $\delta$. Accordingly, there may be a K-number of check nodes $c(1)$ to $c(K)$ corresponding to the K-number of parity bits in the parity bit sequence $\delta$. A particular variable node may be connected to a particular check node via an edge or connection if the element in the parity-check matrix H corresponding to that variable node and that check node has a 1 value instead of a 0 value. For example, FIG. 7 shows an edge connecting the first variable node $v(1)$ and the first check node $c(1)$.

In other example configurations, an error correction code stored in the code module 506 is a data set that has a corresponding generating matrix G. Unlike the parity-check matrix, the generating matrix G may not be a low-density matrix or otherwise considered sparse. For such example configurations, the parity bit generator module 504 may generate the codeword $\omega$ according to the following mathematical formula:

$$\omega=\beta G, \quad (3)$$

where G is the generating matrix, $\beta$ are the information bits, and $\omega$ is the codeword. Similar to the parity-check matrix H, the generating matrix G may have its own associated Tanner graph that includes variable nodes, check nodes, and edges.

Referring back to FIG. 5, upon retrieving an error correction code from the code module 506, the parity bit generator module 504 may use the error correction code to generate the parity bits $\delta$ for the unencoded information bit sequence $\beta$ stored in the unencoded data portion 508 of the RAM 116, such as in accordance with equations (1), (2), and/or (3) above. The parity bit generator module 504 may combine the information bits $\beta$ with the associated parity bits $\delta$ to form the codeword $\omega$. Additionally or alternatively, the parity bit generator module 504 may store the codeword $\omega$ in an encoded data portion 510 of the RAM 116.

In order to program a codeword ω in the memory dies 104, the sequencer module 126 retrieves the codeword ω and sends the codeword ω to the memory dies 104 via the memory interface 130. In response, the read/write circuit 144 (FIG. 2B) on the memory die 104 receiving the codeword ω may perform a series of program actions to store the codeword ω in a storage location in the memory cell structure 142 identified by and/or corresponding to the memory address information that was identified in the descriptor module 502.

In some example embodiments, the number of bits of codeword ω formed by the parity bit generator module 504 is not the same as the number of bits that are to be stored in the memory dies 104. One example approach to these embodiments is for the parity bit generator module 504 to use an error correction code that generates a number of parity bits δ that, in turn, forms a codeword ω having a number of bits greater than the number of bits to be stored in the memory dies 104. The components of FIG. 5 further includes a puncture module 512 that receives the codeword ω, and removes or discards a certain number of the parity bits δ from the codeword ω to generate or form a modified or punctured codeword ω'. In some embodiments, the puncture module 512 may remove or discard a certain number of information bits from the codeword ω to generate or form a modified or punctured codeword ω'. The function of removing or discarding bits from the codeword ω performed by the puncture module 512 is referred to as a puncturing process, and the bits that are removed or discarded are referred to as punctured bits pb. After the puncturing module 512 generates the punctured codeword ω', the sequencer module 126 then sends the punctured codeword ω' to the memory dies 104 via the memory interface 130, as previously described.

In addition to the components generally illustrated in FIG. 5, the ECC module 124 further includes a decoder module configured to perform error correction and bit error rate calculation. For error correction, the decoder module is configured to detect and correct for errors (bits having incorrect bit values) in a codeword read from the memory dies 104. To perform error correction, the ECC module 124 may include two sub-modules, including a bit flipping (or hard) decoder sub-module, and a message passing (or soft) decoder sub-module.

A bit flipping decoder performs error correction by flipping bit values of bits (by changing 0 to 1, or 1 to 0) of the read codeword, until it determines that codeword no longer has errors.

A message passing decoder performs error correction through a likelihood ratio or a log likelihood ratio (LLR) update process that includes: calculating and updating a first set of updated LLR values that indicate reliabilities (or likelihoods or probabilities) that bit values are logic 1 or logic 0 values for variable nodes connected to check nodes, and by calculating and updating a second set of updated LLR values that indicate reliabilities (or likelihoods or probabilities) that bit values are logic 1 or logic 0 values for check nodes connected to variable nodes. The message passing decoder iteratively calculates and updates the second sets of LLR values based on the first sets of LLR values, and the first sets of LLR values based on the second sets of LLR values.

In general, the message passing decoder has greater error correction capability than the bit flipping decoder. However, the bit flipping decoder typically takes up less space (cost) (e.g., it is smaller, less costly for the same target performance) and consumes less power (e.g., is more power efficient). In some example configurations, the bit flipping decoder uses 16 times less area and consumes 12-16 times less power for the same performance.

When a punctured codeword ω' is stored in the memory dies 104 and thereafter read, the decoder module reconstructs the original codeword ω from the read punctured codeword ω' as part of the error correction process. When the bit flipping decoder is used, the bit flipping decoder starts the reconstruction process by adding back in the punctured bits pb. In doing so, the bit flipping decoder does not know the correct bit values of the punctured bit pb, and so assigns default logic values to the punctured bits pb, such as logic 0 for example. The addition of bits with default logic values to the read punctured codeword ω' may be referred to as padding. The bit flipping decoder performs padding because it is unable to mark the punctured bits pb as 'erasures,' and is thus unable to mark a bit as unknown. By setting each punctured bit pb to a default logic value, there is a 50% chance that, for each punctured bit pb, the default logic value is correct.

In many situations, the number of punctured bits pb is too great, in that appending punctured bits pb with default bit values to a read punctured codeword ω' introduces too many errors into the read codeword, i.e., forms a reconstructed codeword with too high of a BER for the bit flipping decoder, especially if certain throughput requirements are to be met.

In addition, in some embodiments for bit error rate calculation, the ECC module 124 may calculate the syndrome weight W, and use the syndrome weight to estimate the BER for a read codeword. Where the read codeword was punctured prior to being programmed, padding the read codeword with punctured bits at the default logic value may introduce too many errors into the codeword, such that the syndrome weight W that is calculated from the padded codeword is not a sufficiently accurate estimation of the BER.

The embodiments describe herein add a preliminary stage to the error correction (decode) process and/or to the BER estimation process. In the preliminary stage, a bit estimator module of the ECC engine 124 performs a punctured bit estimation process that includes estimating bit values for punctured bits pb to be added to a read codeword. Upon the bit estimator module performing a punctured bit estimation process, a reconstructed codeword that includes punctured bits pb with estimated bit values is generated, and the decoder module, using either the bit flipping module or the message passing module, performs an errors correction process on the reconstructed codeword.

Figure 8:
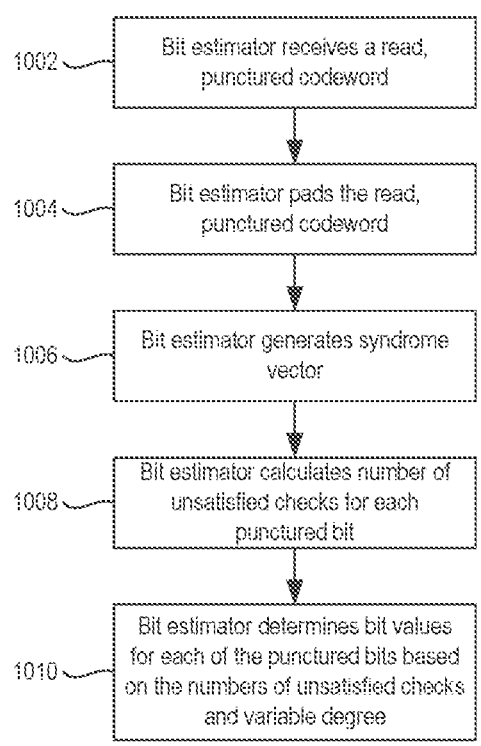
FIG. 8 generally illustrates a flow chart of an example punctured bit estimation process.

FIG. 8 shows a flow chart of an example punctured bit estimation process. At block 1002, the bit estimator module receives a read, punctured codeword y. At block 1004, the bit estimator module pads punctured bits pb, each with a default logic value (e.g., of logic 0) to the read, punctured codeword y to generate a reconstructed codeword y'. At block 1006, the bit estimator module generates a syndrome vector $\bar{s}$ for the reconstructed codeword y'. A syndrome vector $\bar{s}$ is a vector of the syndrome values for all of the checks (e.g., parity checks). Mathematically, a syndrome vector $\bar{s}$ for the reconstructed codeword y' is determined according to the following formula:

$$\bar{s} = H \cdot y', \quad (4)$$

where H is the parity-check matrix used to generate the parity bits for the codeword, y' is a vector of current bit values of the reconstructed codeword, and where the dot-product mathematical calculation denoted in equation (4) is a modulo2 calculation.

At block 1008, the bit estimator module calculates the number of unsatisfied checks for each of the punctured bits pb. For a given ith punctured bit $pb_i$, the bit estimator may calculate an associated ith number of unsatisfied checks $u_i$ by determining the sum of the syndrome values $S_k$ of the checks that are connected to the ith punctured bit $pb_i$. Mathematically, the number of unsatisfied checks $u_i$ may be determined according to the following formula:

$$u_i = \sum_{k \in N(pb_i)} s_k \qquad (5)$$

where $N(b_i)$ denotes all check indices connected to the variable of the ith punctured bit $pb_i$.

At block 1010, the bit estimator estimates bit values for each of the punctured bits pb based on the number of unsatisfied checks and the variable (e.g., bit) degree dv. A variable degree of a variable is the number of check nodes to which the variable is connected. For at least some example embodiments, the bit estimator may determine a bit value for an ith punctured bit $pb_i$ by majority vote, such as according to the following formula:

$$\hat{b}_i = \begin{cases} 0, & \text{if } u_i \leq dv/2 \\ 1, & \text{if } u_i > dv/2 \end{cases} \qquad (6)$$

where $\hat{b}_i$ is the bit value estimated for the ith punctured bit $pb_i$. For the case where $u_i=dv/2$, it is arbitrary whether $\hat{b}_i$ is set to '0', '1', or any other suitable heuristic. In some embodiments, the formula (6) is true for punctured bits pb padded with '0'.

Figure 9:
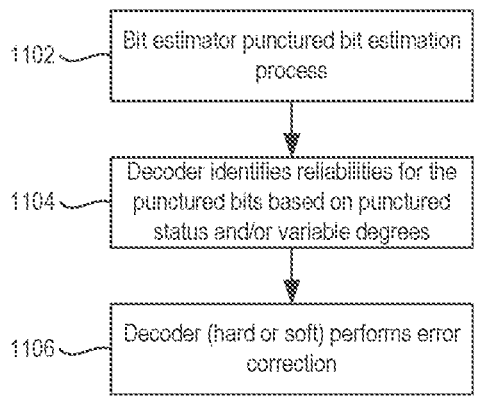
FIG. 9 generally illustrates a flow chart of an example error correction operation that implements the example punctured bit estimation process of FIG. 10.

FIG. 9 shows an example error correction operation that implements the example punctured bit estimation process of FIG. 8. At block 1102, the bit estimator may perform the bit estimation process of FIG. 8. At block 1104, a decoder of the ECC module 124, may identify reliabilities (such as LLR magnitudes, for example) of the punctured bits pb based on their status as being punctured and/or their respective variable degrees. In some embodiments, the decoder of the ECC module 124, may identify reliabilities (such as LLR magnitudes, for example) of the punctured bits pb based on other metrics, such as BER of the codeword, which may be estimated from the codeword or other codewords. At block 1106, the decoder may perform an error correction process to correct erroneous bits in the reconstructed codeword generated from the punctured bit estimation process at block 1102. The decoder that performs the error correction process at block 1106 may be either a bit flipping (hard) decoder that performs bit flipping, or a message passing (soft) decoder that performs a message passing process, in order to correct erroneous bits.

Error correction processes performed with the punctured bit estimation process provides the decoder with the flexibility to support any size memory (e.g., NAND page), and in turn use all of the available parity bits. For embodiments where a bit flipping decoder performs the error correction, the punctured bit estimation process reduces the number of errors added to the reconstructed codeword, compared to embodiments where the decoder merely padded the read codeword. This provides the ability for a bit flipping decoder to perform error correction on punctured codewords, where it previously was not able and/or provides the ability for the bit flipping decoder to perform error correction on punctured codewords faster and with less power. Ultimately, adding the punctured bit estimation process as a preliminary stage to the encoding increases throughput and lowers power of the ECC module 124, in addition to increasing ECC module's correction capability, allowing for better reliability, increasing yield, and faster writes.

In some embodiments, even if a first error correction code is available to generate a first codeword that fits the available storage space for the codeword, decoding performance may be improved without increasing unused parity counts by using a second error correction code that generates a second codeword that is larger than the available storage space, and then puncturing parity bits from that second codeword to reduce its size to one that fits the available storage space.

Figure 10:
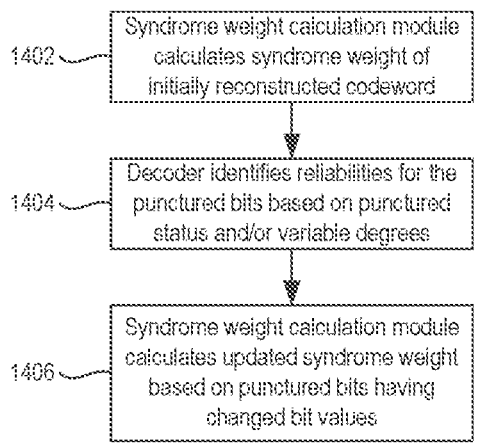
FIG. 10 generally illustrates a flow chart of an example bit error rate estimation process that implements the example puncture bit estimation process of FIG. 10.

FIG. 10 generally illustrates a flow chart of an example bit error rate estimation process that implements the example punctured bit estimation process of FIG. 10. At block 1402, a syndrome weight calculation module calculates an initial syndrome weight W of an initially reconstructed codeword, such as a codeword that has been padded at block 1004 of FIG. 8. The syndrome weight W is the sum of the syndrome values of the syndrome vector $\bar{s}$ determined from equation (4) above. At block 1404, the punctured bit estimator module performs the punctured bit estimation process of FIG. 8 to determine estimated bit values for the punctured bits, and in turn generate a modified, reconstructed codeword. At block 1406, the syndrome weight calculation module recalculates or updates the syndrome weight W for the modified, reconstructed codeword generated at block 1404. If the bit value of a given ith punctured bit $pb_i$ changed its logic value—i.e., the estimated value determined at block 1404 is different than the default value—then the syndrome weight calculation module may update the syndrome weight W by $(dv_i-2u_i)$, where $dv_i$ is the variable degree of the ith variable $v_i$ associated with the given ith punctured bit $pb_i$, and $u_i$ is the number of unsatisfied checks connected to the ith variable $v_i$.

The new syndrome weight W calculated at block 1406 is a more accurate indicate or estimate for the BER, compared to the syndrome weight calculated at block 1402. Accordingly, the ECC engine, through performance of the punctured bit estimation process, can use syndrome weight calculation as a sufficiently accurate way to estimate BER.

In order to implement the punctured bit estimation processes, the codewords read from the memory dies 104 may initially be generated using an error correction code having an LDPC structure with a high lifting factor (e.g., the high lifting factor, which may be typically used to support a high parallelism decoder/encoder, typically causes the granularity of the codeword size to be coarser, which in turn causes larger mismatches between available page size in the NAND and the supported codeword size). Additionally or alternatively, LDPC code matrix may be designed such that the punctured bits pb have relatively high degrees (optional). In addition, the decoder used to perform error correction and/or BER estimation may be designed with relatively high parallelism. These steps may be part of an offline, design phase or stage.

Additionally or alternatively, the punctured bit estimation process may be performed during a read operation, such as in response to a host read command, where a codeword is read from the memory dies 104 and loaded into the RAM 116 for error correction performed by the ECC module 124. In order to read the codeword, the codeword must first be programmed into the memory dies. During the programming, an initial codeword may be generated, and that initial codeword may have parity bits discarded or removed as part of a puncturing process, in order to generate a punctured codeword. At least in some example embodiments, it is the punctured codeword that is stored in the memory dies 104 and thereafter retrieved, that is subjected to the punctured bit estimation process. In some example embodiments, the memory dies may have a predetermined size to store a codeword. The error correction code used during encoding may generate too many parity bits such that the initial codeword that is generated exceeds the predetermined size. The puncture module may then puncture a certain number of parity bits in order to reduce the size of the initial codeword and create a punctured codeword that has a size greater than or equal to the predetermined size.

In some embodiments, a method for punctured bit estimation includes receiving a punctured codeword. The method further includes generating a reconstructed codeword using the punctured codeword and at least one punctured bit having a default logic value. The method further includes generating a syndrome vector for the reconstructed codeword. The method further includes determining, using the syndrome vector, a number of unsatisfied parity-checks for the at least one punctured bit. The method further includes determining, for the at least one punctured bit, a bit value using, at least, the number of unsatisfied parity-checks associated with the at least one punctured bit.

In some embodiments, the default logic value is 0. In some embodiments, generating the syndrome vector includes performing a dot product operation on a parity-check matrix and a current bit values vector. In some embodiments, the parity-check matrix is associated with parity bits of the reconstructed codeword. In some embodiments, the current bit values vector includes a vector of current bit values of the reconstructed codeword. In some embodiments, determining the number of unsatisfied parity-checks for the at least one punctured bit includes calculating, for the at least one punctured bit, a sum of syndrome values of the syndrome vector that are associated with the at least one punctured bit. In some embodiments, determining the bit value for the at least one punctured bit includes using a variable degree associated with the at least one punctured bit. In some embodiments, determining the bit value for the at least one punctured bit includes determining a majority vote using the number of unsatisfied parity-checks associated with the at least one punctured bit and the variable degree associated with the at least one punctured bit.

In some embodiments, a memory system includes a non-volatile storage and a controller. The non-volatile storage includes at least one memory die and the controller is in communication with the at least one memory die. The controller is configured to: receive a punctured codeword; generate a reconstructed codeword using the punctured codeword and at least one punctured bit having a default logic value; generate a syndrome vector for the reconstructed codeword; determine, using the syndrome vector, a number of unsatisfied parity-checks for the at least one punctured bit; and determine, for the at least one punctured bit, a bit value using, at least, the number of unsatisfied parity-checks associated with the at least one punctured bit.

In some embodiments, the default logic value is 0. In some embodiments, the controller is further configured to generate the syndrome vector by performing a dot product operation on a parity-check matrix and a current bit values vector. In some embodiments, the parity-check matrix is associated with parity bits of the reconstructed codeword. In some embodiments, the current bit values vector includes a vector of current bit values of the reconstructed codeword. In some embodiments, the controller is further configured to determine the number of unsatisfied parity-checks for the at least one punctured bit by calculating, for the at least one punctured bit, a sum of syndrome values of the syndrome vector that are associated with the at least one punctured bit. In some embodiments, the controller is further configured to determine the bit value for the at least one punctured bit using a variable degree associated with the at least one punctured bit. In some embodiments, the controller is further configured to determine the bit value for the at least one punctured bit by determining a majority vote using the number of unsatisfied parity-checks associated with the at least one punctured bit and the variable degree associated with the at least one punctured bit.

In some embodiments, a system for performing punctured bit estimation includes a controller in communication with at least one memory die. The controller is configured to receive a punctured codeword; generate a reconstructed codeword using the punctured codeword and at least one punctured bit having a default logic value; generate a syndrome vector for the reconstructed codeword by performing a dot product operation on a parity-check matrix and a current bit values vector; determine, using the syndrome vector, a number of unsatisfied parity-checks for the at least one punctured bit by calculating a sum of syndrome values of the syndrome vector that are associated with the at least one punctured bit; and determine, for the at least one punctured bit, a bit value using, at least, the number of unsatisfied parity-checks associated with the at least one punctured bit.

In some embodiments, the default logic value is 0. In some embodiments, the parity-check matrix is associated with parity bits of the reconstructed codeword. In some embodiments, the current bit values vector includes a vector of current bit values of the reconstructed codeword.

In some embodiments, a method for bit error rate estimation includes calculating an initial syndrome weight of an initially reconstructed codeword using syndrome values of a first syndrome vector associated with the initially reconstructed codeword. The method also includes generating a modified reconstructed codeword using a punctured codeword and at least one punctured bit having a default logic value. The method also includes generating a second syndrome vector for the modified reconstructed codeword by performing a dot product operation on a parity-check matrix and a current bit values vector. The method also includes calculated an updated syndrome weight using the initial syndrome weight and the modified reconstructed codeword. The method also includes estimating a bit error rate for a read codeword using the updated syndrome weight.

It is intended that the foregoing detailed description be understood as an illustration of selected forms that the invention can take and not as a definition of the invention. It is only the following claims, including all equivalents, that are intended to define the scope of the claimed invention. Finally, it should be noted that any aspect of any of the preferred embodiments described herein can be used alone or in combination with one another.

What is claimed is:

1. A method for punctured bit estimation performed by an error correction code (ECC) module, the method comprising:
   a bit estimator of the ECC module receiving a punctured codeword from one or more memory dies;
   the bit estimator padding at least one punctured bit of the punctured codeword with a default logic value, thereby generating a reconstructed codeword;
   the bit estimator generating a syndrome vector for the reconstructed codeword;

the bit estimator determining, using the syndrome vector, a number of unsatisfied parity-checks for the reconstructed codeword;

the bit estimator determining, for the at least one punctured bit, a bit value using, at least, the number of unsatisfied parity-checks associated with the at least one punctured bit; and the ECC module performing an error correction process to correct erroneous bits in the reconstructed codeword.

2. The method of claim 1, wherein the default logic value is 0.

3. The method of claim 1, wherein the bit estimator generating the syndrome vector comprises performing a dot product operation on a parity-check matrix H used to generate parity bits for the reconstructed codeword and a current bit values vector which is a vector of current bit values of the reconstructed codeword.

4. The method of claim 3, wherein the parity-check matrix is associated with parity bits of the reconstructed codeword.

5. The method of claim 3, wherein the current bit values vector includes a vector of current bit values of the reconstructed codeword.

6. The method of claim 1, wherein the bit estimator determining the number of unsatisfied parity-checks for the at least one punctured bit comprises calculating, for the at least one punctured bit, a sum of syndrome values of the syndrome vector that are associated with the at least one punctured bit.

7. The method of claim 1, wherein the bit estimator determining the bit value for the at least one punctured bit comprises using a variable degree associated with the at least one punctured bit.

8. The method of claim 7, wherein the bit estimator determining the bit value for the at least one punctured bit comprises determining a majority vote using the number of unsatisfied parity-checks associated with the at least one punctured bit and the variable degree associated with the at least one punctured bit.

9. A controller comprising:
a bus interface configured to receive a punctured codeword; and
an error correction code (ECC) module comprising a processor, wherein the processor comprises:
the bit estimator configured to
pad at least one punctured bit of the punctured codeword with a default logic value, thereby generating a reconstructed codeword;
generate a syndrome vector for the reconstructed codeword;
determine, using the syndrome vector, a number of unsatisfied parity-checks for the reconstructed codeword;
determine, for the at least one punctured bit, a bit value using, at least, the number of unsatisfied parity-checks associated with the at least one punctured bit; and
wherein the ECC module is further configured to perform an error correction process to correct erroneous bits in the reconstructed codeword.

10. The controller of claim 9, wherein the default logic value is 0.

11. The controller of claim 9, wherein the bit estimator is further configured to generate the syndrome vector by performing a dot product operation on a parity-check matrix H used to generate parity bits for the reconstructed codeword and a current bit values vector which is a vector of the current bit values of the reconstructed codeword.

12. The controller of claim 11, wherein the parity-check matrix is associated with parity bits of the reconstructed codeword.

13. The controller of claim 11, wherein the current bit values vector includes a vector of current bit values of the reconstructed codeword.

14. The controller of claim 9, wherein the bit estimator is further configured to determine the number of unsatisfied parity-checks for the at least one punctured bit by calculating, for the at least one punctured bit, a sum of syndrome values of the syndrome vector that are associated with the at least one punctured bit.

15. The controller of claim 9, wherein the bit estimator is further configured to determine the bit value for the at least one punctured bit using a variable degree associated with the at least one punctured bit.

16. The controller of claim 15, wherein the bit estimator is further configured to determine the bit value for the at least one punctured bit by determining a majority vote using the number of unsatisfied parity-checks associated with the at least one punctured bit and the variable degree associated with the at least one punctured bit.

17. A method for bit error rate estimation, comprising:
a bit estimator of an error correction code (ECC) module calculating an initial syndrome weight of an initially reconstructed codeword using syndrome values of a first syndrome vector associated with the initially reconstructed codeword;
the bit estimator padding at least one punctured bit of the initially reconstructed codeword with a default logic value, thereby generating a modified reconstructed codeword;
the bit estimator generating a second syndrome vector for the modified reconstructed codeword by performing a dot product operation on a parity-check matrix H used to generate parity bits for the modified reconstructed codeword and a current bit values vector which is a vector of current bit values of the modified reconstructed codeword;
the bit estimator calculating an updated syndrome weight using the initial syndrome weight and the modified reconstructed codeword; and
the bit estimator estimating a bit error rate for a codeword, read from a memory die, using the updated syndrome weight.

18. The method of claim 17, wherein the default logic value is 0.

19. The method of claim 17, wherein the parity-check matrix is associated with parity bits of the modified reconstructed codeword.

20. The method of claim 17, wherein the current bit values vector includes a vector of current bit values of the modified reconstructed codeword.

* * * * *